(12) United States Patent
Dacus et al.

(10) Patent No.: US 6,172,579 B1
(45) Date of Patent: Jan. 9, 2001

(54) THREE POINT MODULATED PHASE LOCKED LOOP FREQUENCY SYNTHESIS SYSTEM AND METHOD

(75) Inventors: Farron L. Dacus, Irving, TX (US); Steven P. Hendrix, Sagamore Hills, OH (US)

(73) Assignee: Cleveland Medical Devices Inc., Cleveland, OH (US)

( * ) Notice: Under 35 U.S.C. 154(b), the term of this patent shall be extended for 0 days.

(21) Appl. No.: 09/241,810

(22) Filed: Feb. 2, 1999

(51) Int. Cl.[7] .................................................... H03L 3/00
(52) U.S. Cl. ......................... 332/128; 331/17; 455/260; 455/76
(58) Field of Search ...................... 332/128; 331/16, 331/17, 25; 455/260, 76

(56) References Cited

U.S. PATENT DOCUMENTS

| | | | |
|---|---|---|---|
| 3,393,380 | 7/1968 | Webb | 332/144 |
| 4,052,672 | 10/1977 | Enderby | 332/144 |
| 4,242,649 | 12/1980 | Washburn | 332/128 |
| 4,313,209 | 1/1982 | Drucker | 455/112 |
| 4,546,331 | 10/1985 | DaSilva et al. | 332/128 |
| 4,573,026 | 2/1986 | Curtis et al. | 332/124 |
| 4,609,886 | 9/1986 | Takaki et al. | 332/127 |
| 4,670,888 | 6/1987 | Smith | 375/303 |
| 4,866,404 | 9/1989 | Vandegraaf | 332/127 |
| 5,097,230 | 3/1992 | Lautzenhiser | 332/127 |
| 5,266,907 | 11/1993 | Dacus | 331/1 A |
| 5,493,257 | 2/1996 | Chadwick | 332/100 |

Primary Examiner—Arnold Kinkead

(57) ABSTRACT

The present invention relates to a frequency modulated system, and a method for operating same, including a phase locked loop frequency synthesizer circuit which synthesizes a carrier frequency through the use of an electronically controlled oscillator. The circuit, which has a certain loop bandwidth, includes a reference frequency source and a bypassed correcting integrator. A modulating signal simultaneously modulates the oscillator, the reference frequency source and the bypassed correcting integrator such that the carrier frequency is frequency modulated with a certain frequency deviation. The magnitude of the modulation of the oscillator, the reference frequency source and the correcting integrator are controlled over a frequency range by frequency blending the reference frequency source and the bypassed correcting integrator such that low distortion modulation over a wide frequency range is achieved.

20 Claims, 19 Drawing Sheets

IDEAL CORRECTING INTEGRATOR CIRCUIT

THREE POINT MODULATED PHASE LOCKED LOOP FREQUENCY SYNTHESIS SYSTEM AND METHOD

STATEMENT REGARDING FEDERALLY SPONSORED RESEARCH OR DEVELOPMENT

This invention was made with Government support under Contract No. 5R44MH54949-03 awarded by the National Institute of Mental Health and Contract No. 2R44NS35418-02 awarded by the National Institute of Neurological Disorders and Stroke. The Government has certain rights in the invention.

BACKGROUND OF THE INVENTION

1. Field of the Invention

The present invention relates, generally, to the field of radio frequency signal generation and wireless communications, and particularly to low power portable wireless communications, examples of which include cellular radio and Personal Communications Systems (PCS), point to point data communications, wireless data acquisition, and wireless automatic identification, remote control, and status reporting.

2. Description of the Related Art

The radio link performance for "MicroRadio™" equipment such as wireless data acquisition, local area data links, garage door openers, vehicle toll tags, RF auto ID, and remote keyless entry systems is often limited by the high emphasis placed upon small size and low cost. In recent years, designers of portable communications equipment such as cellular and PCS handsets have also been under severe pressure to reduce size, cost, and power consumption. Progress in equipment design in these fields requires advances in performance where the necessary low cost and size are still maintained. MicroRadio is a trademark of Cleveland Medical Devices Inc.

Early radio equipment used frequency control based on free running (not contained in a control loop) inductor/capacitor (LC) resonator oscillators. The equipment was plagued with frequency stability problems, and had no facility for anything other than manual tuning. With the advent of software controlled phase locked loop (PLL) frequency synthesizers, a stable, frequency agile, software controlled RF source became available. Advances in electronic technology, and particularly in integrated circuit design, has resulted in size reduction to the point of high portability. These compact synthesizers allow transmitters and channel defining local oscillators in receivers to be set via software control to any of a large number of frequencies uniformly distributed across the band of interest. The most recent advances make feasible the application of frequency synthesis to MicroRadio systems provided that modulation can be provided for without unduly increasing the size and power consumption.

There is a long history of attempts to directly modulate PLL synthesizers, with varying degrees of efficiency and success. The structure and operation of a PLL makes high performance efficient modulation appear quite feasible. The PLL has within it an Electronically Controlled Oscillator (ECO), which typically uses voltage as the frequency control variable and is thus usually referred to as a Voltage Controlled Oscillator (VCO). Although for the sake of convenience "voltage" is often referred to as the signal or control variable, it is understood that current or another electronic variable could be substituted. The generation of the precise voltage (or other electronic variable as the case may be) needed to steer the VCO to the desired frequency is the main function of the system. Simply summing a modulating voltage into the resulting steering voltage will frequency modulate the PLL around the carrier frequency, but results in serious difficulties. The primary problem revolves around the fact that the PLL views the modulation as error that it must correct, resulting in distortion of the desired modulation. A long patent history testifies to the work that has been invested in attempting to effectively solve this elusive problem, the net result of which has been only a partial success.

U.S. Pat. No. 3,393,380 granted to Webb and assigned to the National Aeronautics and Space Administration, PHASE LOCKED PHASE MODULATOR INCLUDING A VOLTAGE CONTROLLED OSCILLATOR, 1968, presents the earliest example of frequency modulation of a phase locked loop. This simple early form injects the modulation into the phase detector output, which has the disadvantages of limited modulation rate due to the filtering action of the subsequent low pass loop filter, as well as allowing distortion to be introduced by the response of the phase locked loop to the modulation. It did, however, represent an advance on the frequency modulation techniques used at the time. The intended application was space communications. No method of preventing the phase locked loop from distorting the desired FM is presented.

A fundamental method of improving the modulation capability of a PLL is to modulate its reference frequency in sympathy with its electronically controlled oscillator. The goal of this is to prevent the loop phase detector from detecting the modulation as frequency error, and leading to the PLL distorting the modulation through its closed loop action of driving all frequency error to zero. There does not appear to be any existing patent on this method, but it has been known in the art for many years. For example, it is implied in U.S. Pat. No. 4,052,672 granted to Enderby et al. in 1977, and described in detail without reference to any patents as well known prior art by Drucker in U.S. Pat. No. 4,313,209, filed in 1980 and issued in 1982. The method is limited by the low modulation bandwidth of practical voltage controlled crystal oscillators (VCXOs) normally used as reference frequency sources. Again, it is noted that a frequency steerable reference frequency source that is crystal based is in more general terms described as an Electronically Controlled Crystal Oscillator (ECXO), and that in the most general terms where the reference source is not necessarily crystal based it may be referred to as an Electronically Controlled Reference Source (ECRS). Unmentioned in previous patents, but shown in detail herein, is that for low distortion modulation the normally crystal based reference oscillator modulation bandwidth must greatly exceed the PLL loop bandwidth. Since the modulation bandwidth of crystal oscillators is very limited, the PLL loop bandwidth becomes extremely limited. This results in long lock times and elimination of the benefits of wider loop bandwidths, such as suppression of vibration induced noise. The nonlinearity of the common VCXO is a source of large distortion in this method, particularly for wider frequency deviations. However, practical linearizing techniques to deal with the high nonlinearity of typical VCXO's are not commonly known in the art.

U.S. Pat. No. 4,052,672, EXTENDED PHASE-RANGE, HIGH FIDELITY MODULATION ARRANGEMENT issued to Enderby in 1977 and assigned to Motorola, Inc., presents another fundamental improvement to the modulated PLL that, like the modulated reference method, has the purpose of eliminating phase detector output that would normally result from modulation. A "correcting integrator" is added to the system that generates a voltage of equal magnitude and opposite sign to the phase detector output component due to modulation applied to the VCO. This correcting integrator output is summed with the phase detector output to cancel loop response to modulation. This breakthrough concept is quite elegant in the way it attacks the root of the problem, and subsequently evolved into the major technique applied for frequency modulating the phase locked loop synthesizer. Numerous subsequent patents have incorporated this excellent basic technique. The method shall be referred to herein as the "two point correcting integrator form", as modulation is applied to the correcting integrator and the voltage controlled oscillator, or as the "Enderby form". While the Enderby form is effective and highly circuit efficient, it does not allow DC modulation due to the fact that build up of phase error associated with DC modulation will eventually cause either the correcting integrator or the phase detector to exceed their dynamic ranges, at which point the PLL will either lose lock or lose the effect of the correcting integrator. Also not mentioned is the fact that with digital phase detectors the encoding of phase error as pulse width introduces noise and distortion that may set severe limits on the low frequency content of the modulation or on the allowed phase locked loop bandwidth.

The Enderby two point correcting integrator form is incorporated and extended in numerous subsequent patents. This refinement process begins with U.S. Pat. No. 4,242,649, METHOD AND APPARATUS FOR MODULATING A PHASE LOCKED LOOP, issued to Washburn in 1980 and assigned to Harris Corporation. The refinement is the addition of modification of the correcting integrator transfer function to take into account second order effects in the PLL. These are significant improvements for practical design, but do not address the lower frequency limits of the method.

U.S. Pat. No. 4,313,209, PHASE-LOCKED LOOP FREQUENCY SYNTHESIZER INCLUDING COMPENSATED PHASE AND FREQUENCY MODULATION, issued to Drucker in 1982 and assigned to John Fluke Mfg. Co., Inc., extends Enderby to also include phase modulation. For the phase modulated form the correcting integrator becomes a correcting amplifier, and the modulating signal summed into the VCO input is differentiated to compensate for the fact that the VCO act as integrator of input voltage to output phase. This invention also incorporates a mixer and a second phase locked loop embedded within the main loop in order to provide means for finer frequency stepping and for filtering any mixer spurious products. The method does not provide for DC frequency modulation capability.

U.S. Pat. No. 4,546,331, FREQUENCY MODULATION IN A PHASE LOCKED LOOP, issued to DaSilva in 1985 and assigned to Hewlett Packard Company, solves the problems of limited correcting integrator and phase detector dynamic ranges, the first extension of Enderby allowing DC modulation of the two point correcting integrator form. The solution involves a complex method of removing charge from the correcting integrator and a corresponding amount of phase error from the phase detector. The method is highly functional, but requires custom design of PLL subsystems that does not take advantage of available phase locked loop synthesizer integrated circuits. Its complexity and power consumption make it suitable for larger equipment. U.S. Pat. No. 4,573,026, FM MODULATOR PHASE LOCKED LOOP WITH FM CALIBRATION, issued to Curtis in 1986 and assigned to Hewlett Packard company, presents a method of digitally "linearizing" a voltage controlled oscillator with respect to a control voltage. This method is intended to be utilized in the design of frequency modulated phase locked loops. Like the DaSilva patent, the method involves custom high performance circuitry for precisely adding and remove charge corresponding to two pi radians of phase shift. The patent illustrates the need for compensation of unit to unit and frequency variable parameters in the subsystems of a modulated PLL in order to maintain performance.

U.S. Pat. No. 4,866,404, PHASE LOCKED FREQUENCY SYNTHESIZER WITH SINGLE INPUT WIDEBAND MODULATION SYSTEM, issued to Vandegraaf in 1989 and assigned to General Electric Company, is a variation on the idea of the basic correcting integrator patent of Enderby. In this variation the bypassed correcting integrator is not summed into the phase detector output. Instead additional electronic functions equivalent to scaling and the loop filter are cascaded with the correcting integrator and the resulting output summed into the VCO control input or inputs in order to cancel loop response to modulation as phase error. Another way of saying this is that the summing in of the correcting integrator occurs on the output side of the loop filter instead of the input side, thus requiring a copy of the loop filter to be inserted in order to arrive at the same transfer function. This method offers no fundamental performance advance over the originally presented Enderby form, has the same weakness of not allowing DC modulation, and has the disadvantage of additional circuitry.

U.S. Pat. No. 5,097,230 issued to Lautzenhiser in 1992 and assigned to Emhiser Research Limited, PHASE LOCKED LOOP THAT INCLUDES DC MODULATION, presents another method that allows the highly desirable feature of DC modulation in a phase locked loop. The method involves a mixer in the feedback loop that allows a second modulated signal source to be mixed with the desired VCO output so that the mixer output may remain constant under modulation. This complicated technique and other similar methods are highly applicable and useful in classes of equipment that are not extremely size, cost, and power limited. However, like the DaSilva and Curtis patents, its complexity make it suitable for non-portable wireless applications.

U.S. Pat. No. 4,670,888, issued to Smith and assigned to Agile Systems, details a method of modulation based on reprogramming the main voltage controlled oscillator divider in sympathy with digital data. This method is limited to frequency deviations equal to multiples of the channel stepping frequency of the synthesizer, and suffers from unacceptable distortion in practice unless the loop bandwidth is made extremely low. The need for high divider programming update rates requires high speed parallel divider programming, thus leading to physically larger designs than the more common and convenient serially loaded synthesizer integrated circuits would allow.

U.S. Pat. No. 5,266,907, issued to Dacus and assigned to Timeback FLL, details a new method of modulatable frequency synthesis based on a frequency locked loop using a delta sigma frequency detector. The method eliminates many of the difficulties involved in modulation of a phase locked control loop, due to the fact that loop response to frequency modulation may be cancelled with only a correcting amplifier as opposed to an integrator. However, it is not conveniently implemented with available components due to the lack of commercially manufactured synthesizer integrated circuits based on the new concept of a delta sigma frequency encoder.

With regards to the problem of initiating digital modulation without introducing frequency error, U.S. Pat. No.

5,493,257 to Chadwick and assigned to Plessy Semiconductor Limited, MODULATOR WITH BIASING CIRCUIT TO MINIMIZE OUTPUT DISTORTION, presents a method for efficient implementation of "midpoint" modulation in an FM PLL system. Midpoint modulation may be defined as a method of initiating modulation where frequency is initially at the nominal carrier frequency and deviates out to the state that defines a logic one or zero, with the initial deviation one half of the normal peak to peak deviation. If the very first deviation were equal to the nominal peak to peak, starting from the midpoint would deviate the first swing too far (twice too much), and would result in an undesired transient response while the PLL brings the midpoint of the frequency deviation back to the nominal carrier frequency. The technique presented by Chadwick performs proper midpoint modulation by AC coupling of the desired modulation, so it prevents excess deviation and resulting transient response at the expense of a lower limit on the modulation or data rate. U.S. Pat. No. 4,609,886 to Takaki and assigned to Pioneer Electronic Corporation, PLL MODULATION CIRCUIT, presents a method of attaining true DC coupling with midpoint modulation. The present invention includes significantly simpler methods of attaining similar results.

None of the above patents teach any methods that provide for the combination of high quality frequency modulation with DC modulation capability, convenient calibration for unit to unit, temperature, and frequency variation, and that are suitable to highly portable low power equipment manufactured with commercially available components. The modulation initiation solutions presented either ignore DC modulation or are overly complex for this class of equipment as well. Accordingly, a need still exists for an apparatus which provides high quality DC and AC modulation of a phase locked loop synthesizer within the size, cost, and power constraints of MicroRadio and other highly compact portable wireless applications.

BRIEF SUMMARY OF THE INVENTION

The present invention provides an apparatus and a method to satisfy the aforementioned need.

Accordingly, one object of the present invention is to provide a low power and circuit efficient method of both DC and AC modulating a phase locked loop synthesizer, and for this modulation to be of high quality.

Another object of the present invention is to provide for precise digitally controlled calibration of the modulated synthesizer, including compensation of variation over unit to unit, frequency, and temperature variation. For example, the VCO or other ECO in the PLL has a gain that is typically nonlinear with frequency and varies significantly from unit to unit, and correct operation requires that this be compensated for. Similarly variation from unit to unit, over the modulation frequency range, and over temperature in the voltage controlled crystal oscillator (VCXO) or other reference source must be compensated for.

Another object of the present invention is to provide an efficient method of properly initiating modulation so that there is no initial excess modulation and resulting transient response that prevents immediate accurate modulation. Still another object is to extend the modulation frequency deviation range beyond that allowed by the limited tune range of the VCXO or other reference.

Accordingly, the present invention relates to a three point frequency modulated system, comprising a phase locked loop frequency synthesizer circuit which synthesizes a carrier frequency utilizing an electronically controlled oscillator. The circuit comprises a reference frequency source, and a bypassed correcting integrator. The circuit has a certain loop bandwidth. A modulating signal having a certain duty cycle simultaneously modulates the electronically controlled oscillator, the reference frequency source and the bypassed correcting integrator such that the carrier frequency is frequency modulated with a certain frequency deviation. A set of magnitude matching functions and frequency blending functions are also included such that the resulting system modulation frequency modulation is provided with the desired frequency deviation and with low distortion throughout a broad range of modulating frequency including that within said loop bandwidth.

In another aspect, the present invention relates to a method of three point frequency modulation, comprising the steps of providing a phase locked loop frequency synthesizer circuit which synthesizes a radio frequency carrier within a certain loop bandwidth utilizing an electronically controlled oscillator, a reference frequency source, and a bypassed correcting integrator; and applying simultaneously a modulating signal to the electronically controlled oscillator, the reference frequency source and the bypassed correcting integrator to frequency modulate the carrier. The method further comprises the step of maintaining proper magnitude matching of modulation of the electronically controlled oscillator, the reference frequency source and the correcting integrator over frequency by frequency blending of the reference frequency source and the bypassed correcting integrator.

In yet another aspect, the present invention relates to a three point frequency modulated system, comprising a phase locked loop frequency synthesizer circuit which synthesizes a radio frequency carrier within a certain loop bandwidth utilizing an electronically controlled oscillator, a reference frequency source, and a bypassed correcting integrator and a loop filter with a loop filter output. A modulating source having a data duty cycle simultaneously modulates the electronically controlled oscillator, the reference frequency source and the bypassed correcting integrator to frequency modulate the carrier with a certain frequency deviation. A filter substantially equivalent to the loop filter is cascaded from the bypassed correcting integrator and summed into the loop filter output.

In yet another aspect, the present invention relates to a method of three point frequency modulation, comprising the steps of providing a phase locked loop frequency synthesizer circuit which synthesizes a radio frequency carrier within a certain loop bandwidth utilizing an electronically controlled oscillator, a reference frequency source, a bypassed correcting integrator and a loop filter; applying simultaneously a modulating signal to the electronically controlled oscillator, the reference frequency source and the correcting integrator to frequency modulate the carrier; providing a filter substantially equivalent to the loop filter cascaded from the correcting integrator; and summing the output of the cascaded correcting integrator and substantially equivalent filter into the output of the loop filter.

In yet another aspect, the invention relates to a three point phase modulated system, comprising a phase locked loop frequency synthesizer circuit which synthesizes a carrier frequency utilizing an electronically controlled oscillator having an output. The circuit comprises a reference frequency source which controls the frequency of the electronically controlled oscillator, and a correcting amplifier. A modulating signal simultaneously modulates the electronically controlled oscillator, the reference frequency source and the correcting amplifier such that the electronically controlled oscillator output is phase modulated.

In still yet another aspect, the invention relates to a method of three point phase modulation, comprising the steps of providing a phase locked loop frequency synthesizer circuit which synthesizes a radio frequency carrier within a certain loop bandwidth utilizing an electronically controlled oscillator, a reference frequency source, and a correcting amplifier; and applying simultaneously a modulating signal to the electronically controlled oscillator, the reference frequency source and the correcting amplifier to phase modulate the carrier.

BRIEF DESCRIPTION OF THE SEVERAL VIEWS OF THE DRAWINGS

Further features of the present invention will become apparent to those skilled in the art to which the present invention relates from reading the following specification with reference to the accompanying drawings in which.

A square wave is used for modulation here and in subsequent figures for ease of viewing distortion, though in practice modulation is usually low pass filtered so as to restrict transmitted bandwidth. Modulation bandwidth of a VCO or VCXO may be defined as that modulating frequency where the resulting frequency deviation is down to 0.707 of what it is at DC modulation. VCO's have inherent high modulation bandwidth, while VCXO's have inherent low modulation bandwidth.

Figure 11:
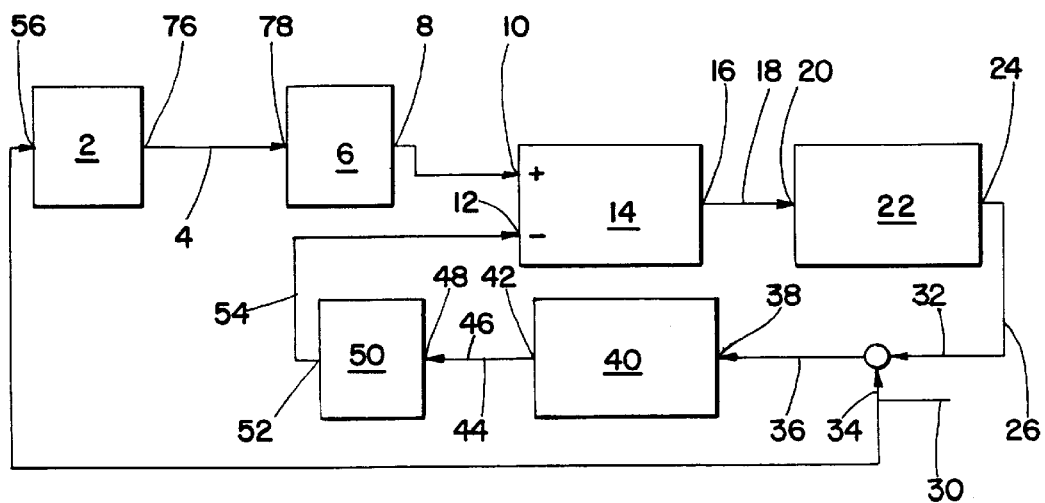
FIG. 11 is a block diagram of prior art two point modulated reference and Voltage Controlled Oscillator (VCO) frequency modulated PLL synthesizer. Here the modulation of the reference frequency in addition to the VCO is intended to keep the PLL from responding to modulation as frequency error, and thereby introducing distortion. In the ideal (but unattainable) case the Voltage Controlled Crystal Oscillator (VCXO) reference would have unlimited bandwidth, while in practice its low pass character will introduce distortion.
Figure 13:
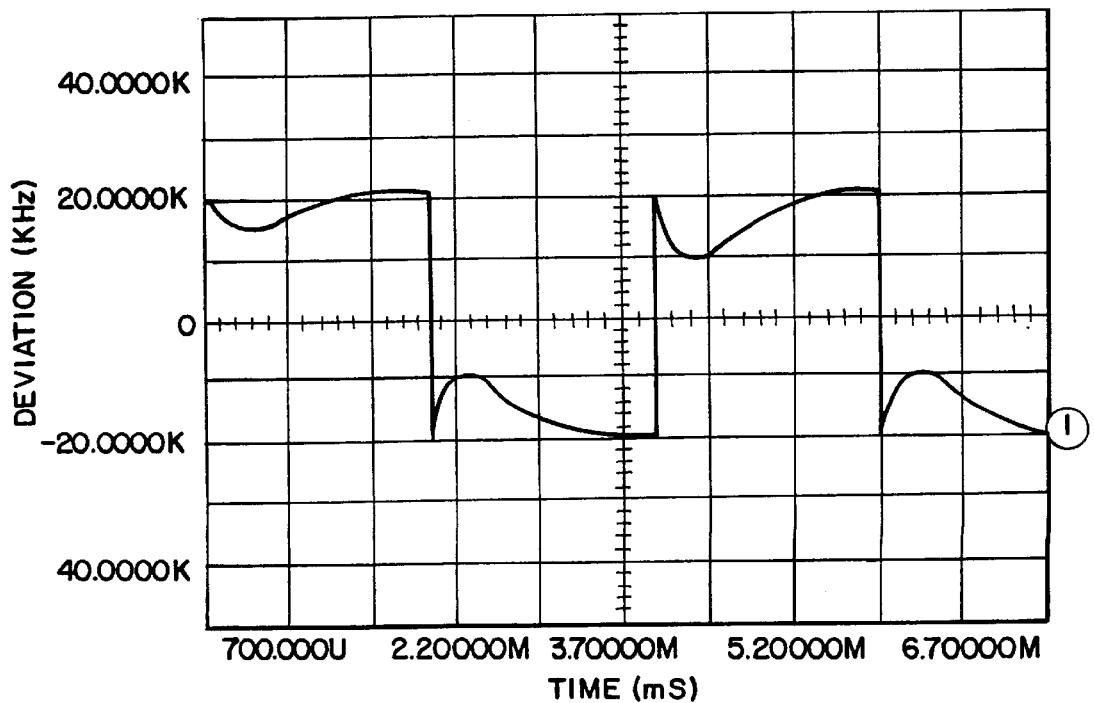

FIG. 13 is the modulated output of the two point modulation of the reference frequency and the VCO of FIG. 11 that is attained in the practical case of limited reference frequency modulation bandwidth, in this case a VCXO modulation bandwidth of 1 KHz, with a modulating frequency equal to the loop natural frequency of 250 Hz. An approximate factor of 10 improvement in signal to distortion ratio is attained in comparison to the uncompensated one point modulated PLL, but the distortion is still significant.

Figure 14:
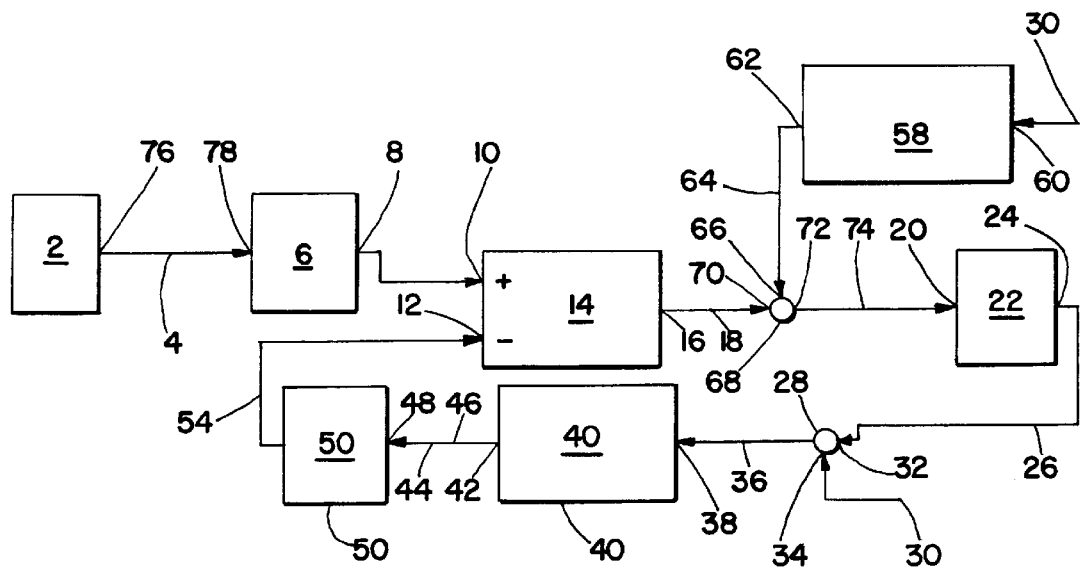

FIG. 14 is the block diagram of prior art two point correcting integrator and VCO modulation. This figure is identical to FIG. 1 except that the correcting integrator and summing node have been added. This well known method (first introduced by Enderby) provides another means of compensating the PLL for modulation distortion, and one that has proven more popular in practice than the two point modulated reference form. It's weakness is lack of DC modulation capability.

Figure 15:
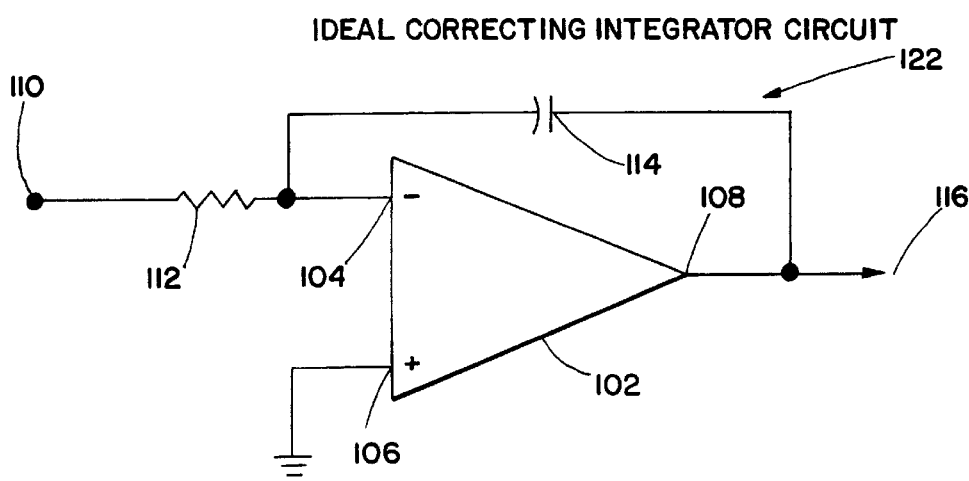

FIG. 15 shows an ideal (but impractical) correcting integrator circuit. Due to unavoidable offset voltage between the operational amplifier inputs, the ideal integrator output will eventually drift to the voltage rails of the system and saturate.

Figure 15A:
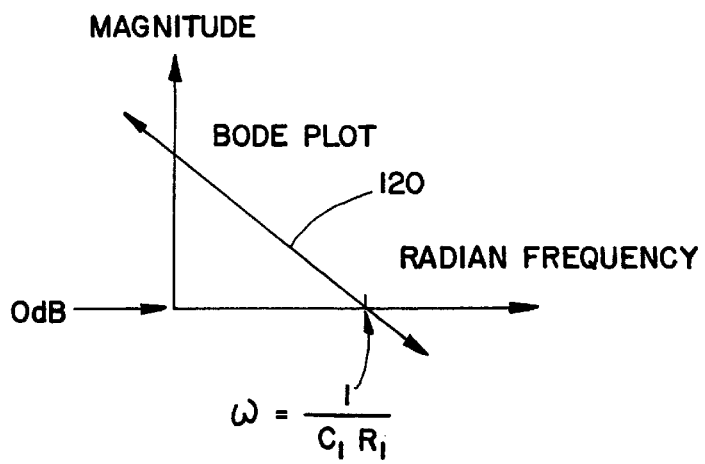

FIG. 15A shows the magnitude Bode plot of the ideal integrator, which approaches infinite gain at zero frequency and has unity gain crossover as shown. The phase response is −90 degrees at all frequency.

Figure 16:
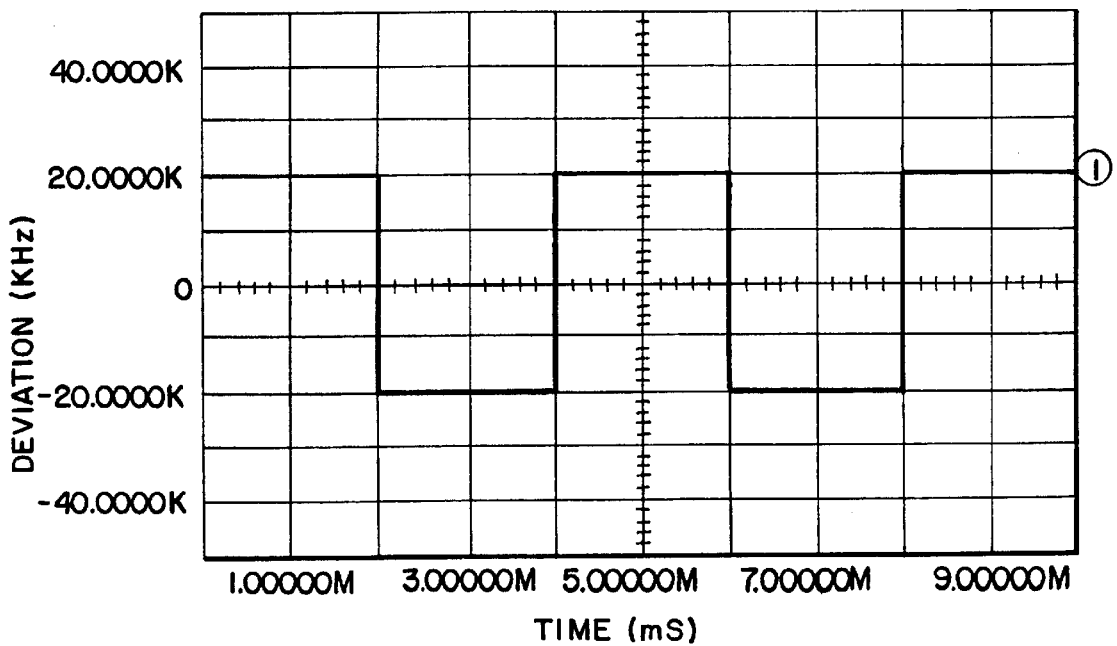

FIG. 16 shows the two point correcting integrator and VCO modulation results of the FIG. 14 block diagram, with ideal correcting integrator as shown in FIG. 15, with loop bandwidth at 354 Hz and modulating signal frequency equal to 250 Hz, or 500 Bits/sec. Perfect modulation results, but this ideal case is unattainable due to the fact that the correcting integrator must in practice be high pass filtered ("bypassed") to prevent its output from drifting to a supply rail and saturating.

Figure 17:
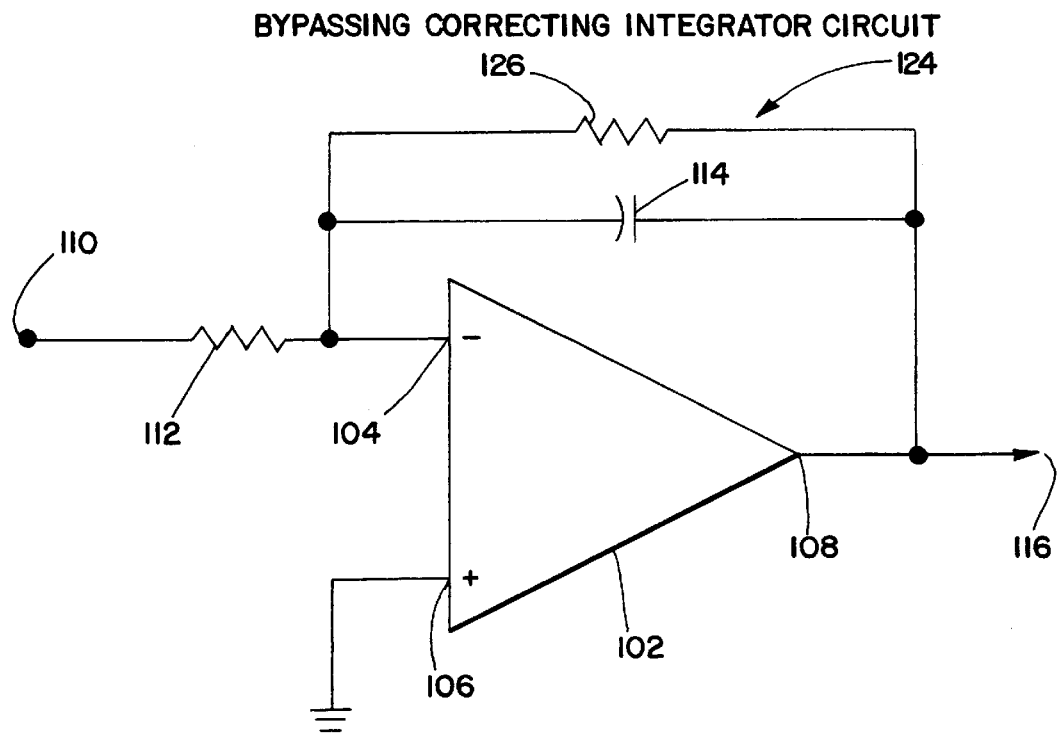

FIG. 17 shows a practical "bypassed" correcting integrator circuit. The integrator circuit capacitor 114 has a resistor 126 in parallel that limits the DC gain the integrator is capable of, preventing small offsets from driving the output to the rail. At high frequencies the circuit acts as an integrator, but at low frequency acts as an amplifier. This limits the "correction" that the correcting integrator can perform to higher frequencies well above the pole frequency introduced by the new resistor.

Figure 17A:
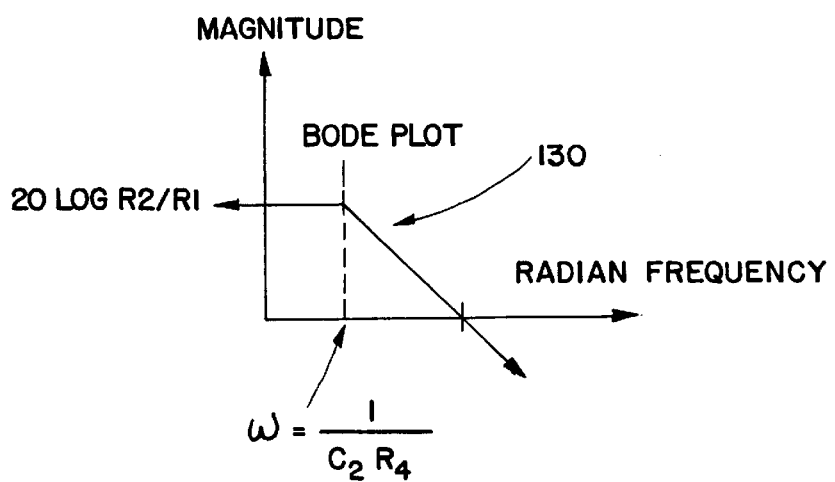

FIG. 17A shows the magnitude Bode pole of the bypassed integrator of FIG. 17. The limited gain and pole frequency introduced by the new resistor are shown.

Figure 18:
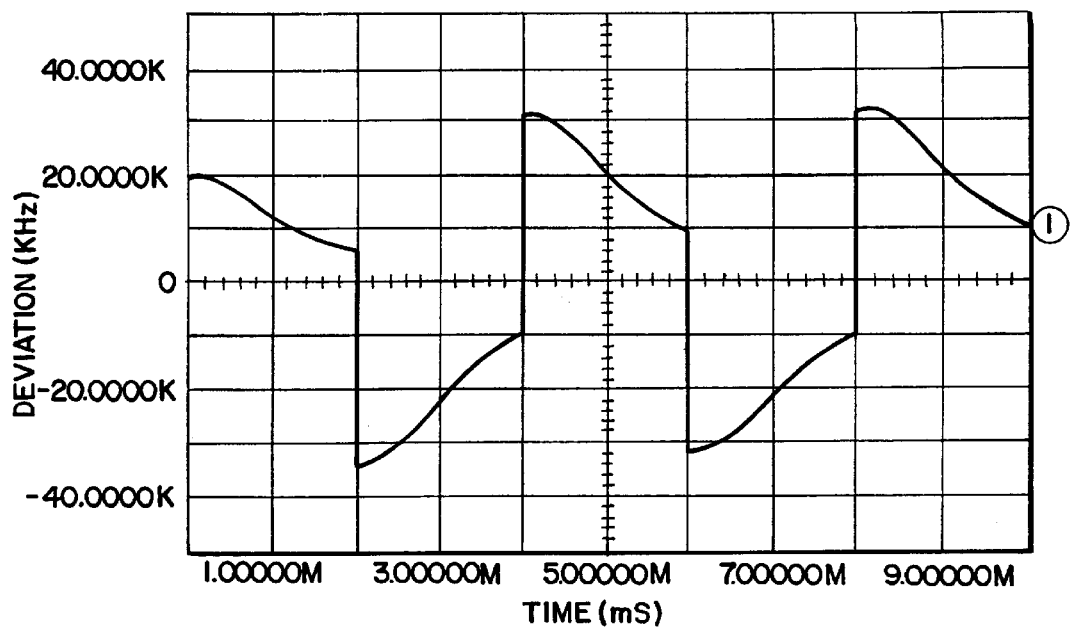

FIG. 18 displays the results of two point modulation, with modulated correcting integrator and VCO as in FIG. 17, using the practical bypassed correcting integrator of FIG. 17, with integrator bypassed (high pass filtered) at 100 Hz. While this practical case is again a major improvement over the uncompensated results of FIG. 8, the distortion is still very significant and more improvement is needed.

Figure 19:
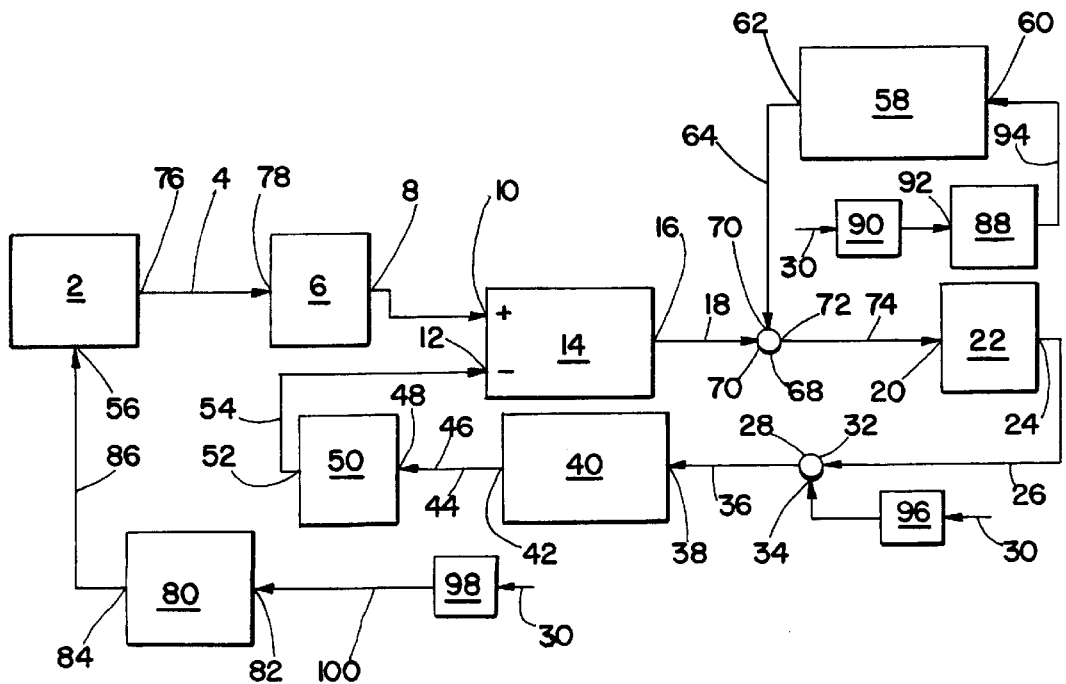

FIG. 19 shows the three point modulation block diagram, with modulated VCXO, correcting integrator and VCO. This figure illustrates an embodiment of the present invention, which is the combination of modulated reference, modulated correcting integrator, and modulated VCO, using practical components, so that the correcting actions of the modulated reference and correcting integrator are properly combined. This combination is non-obvious because the use of both modulated reference and correcting integrator double compensates for PLL response to modulation, and would normally result in severe distortion. However, it will be shown later that the two compensations may be "blended" in such a way that distortion is prevented.

Figure 20:
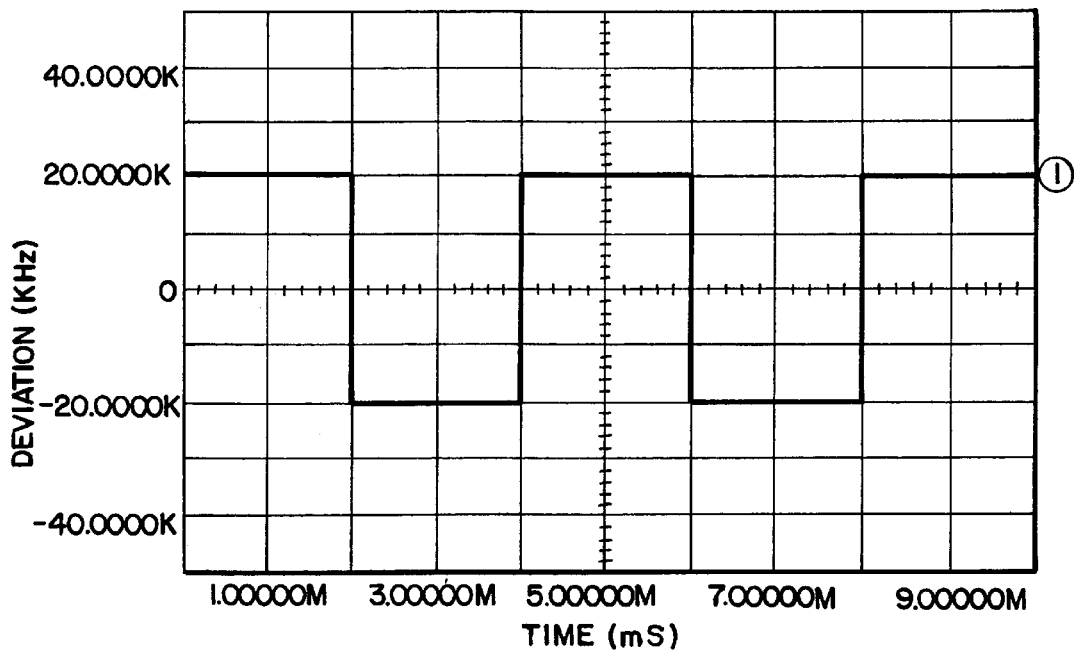

FIG. 20 displays the ideal modulation that results using practical subsystems in the three point modulation method. This is a SPICE simulation output of a fully practical circuit. Here the VCXO is bandwidth limited and the correcting integrator is bypassed, as practice requires and which in either two point form results in significant distortion, but here the disclosed invention blends the compensations of both together so that ideal modulation results.

Figure 21:
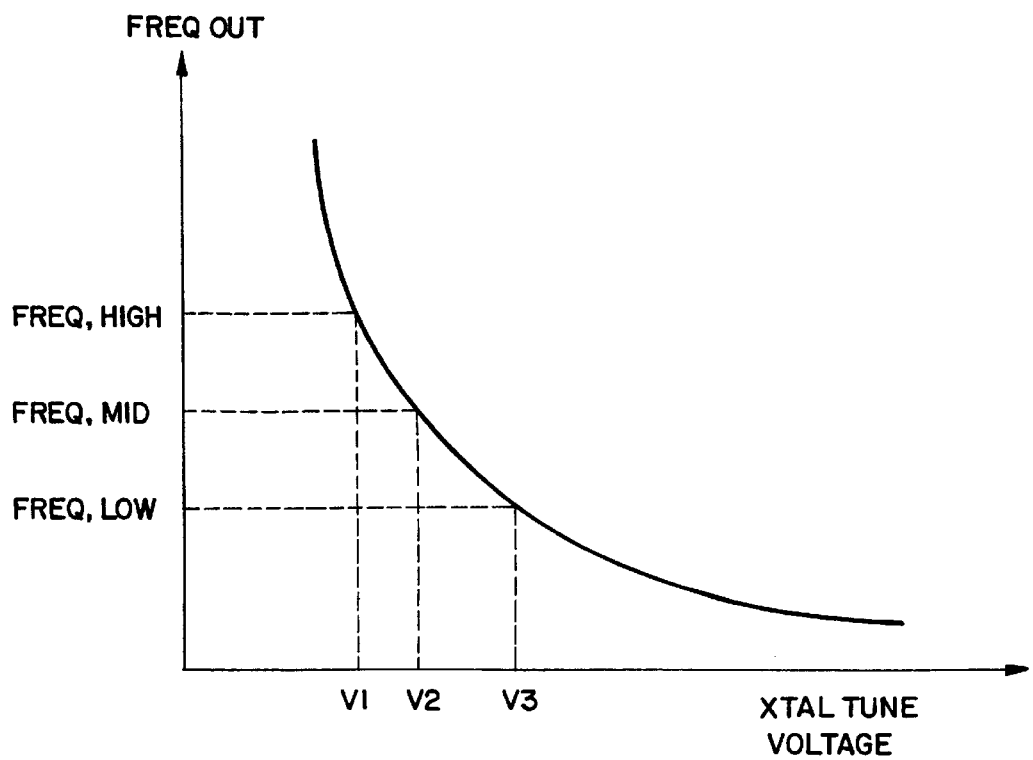

FIG. 21 is the tune curve of a typical Voltage Controlled Crystal Oscillator (VCXO) used as the modulatable reference of the two point modulated reference or three point modulated frequency modulated PLL synthesizer. Here the "tune slope" is negative, with frequency going down as steering voltage goes up. However, a particular design may have either positive or negative tune slope. Note in particular that the tune curve is strongly nonlinear, which in practice will often dictate that a linearization technique be applied to maintain high quality modulation. In the figure shown the typical modulation range is from V1 to V3. The voltage and frequency range outside of V1 to V3 is used for unit to unit and temperature compensation.

Figure 22:
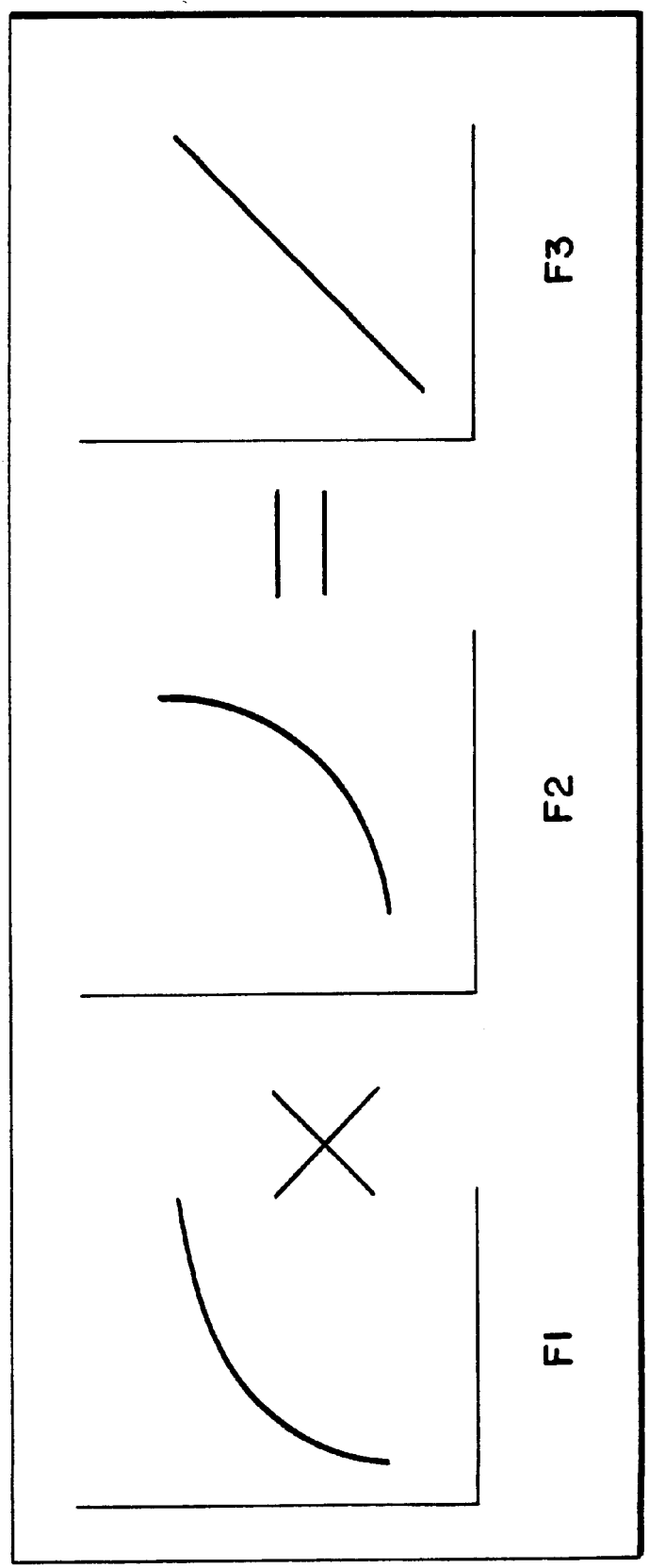

FIG. 22 shows the linearization concept, whereby a nonlinear function is processed by a second "linearizing" function in order to create a new and linear composite function. Such linearizing may be implemented by analog or digital means, but when the original nonlinear quantity shows strong unit to unit variation the linearizing function is usually more easily and accurately implemented in digital form. In that case the linearizing function is conveniently individualized by parameters stored in EEPROM. In the disclosed invention linearization will be applied to both the VCO and VCXO.

Figure 23:
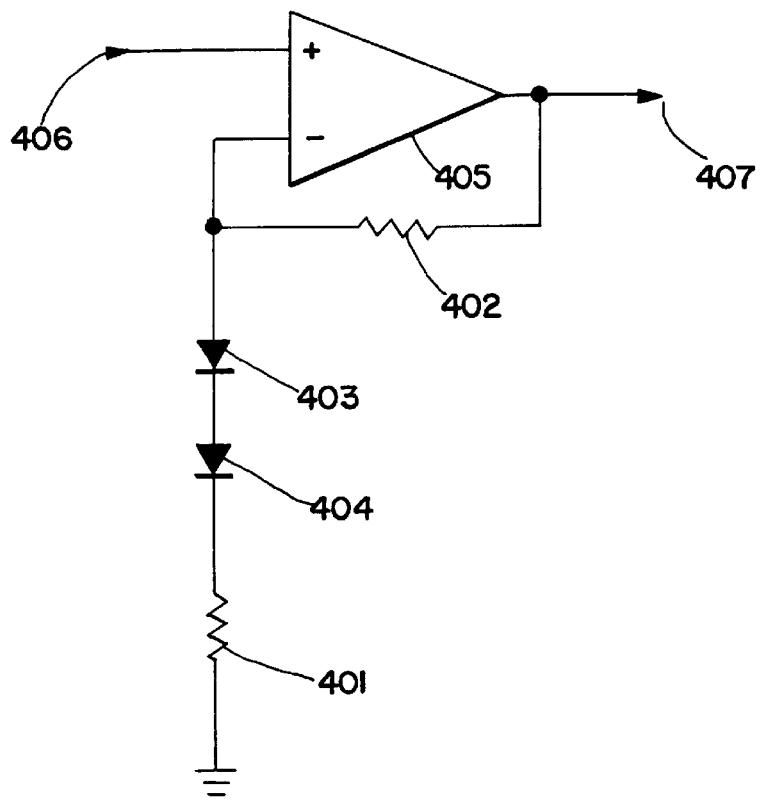

FIG. 23 shows an analog linearizer suitable for approximate linearization of a voltage controlled oscillator. This linearizer shows lower gain for lower input voltages, but as input voltage increases the two diodes begin to turn on and increase the gain. This is appropriate for the linearization of a VCO with a concave down tune slope which shows lower gain (MHz/volt) at the high end of its tune range. Proper design allows for the nonlinearity to cancel the majority of VCO nonlinearity, but such analog linearization is inherently limited in accuracy and in practice may often fall short of desired goals.

Figure 23A:
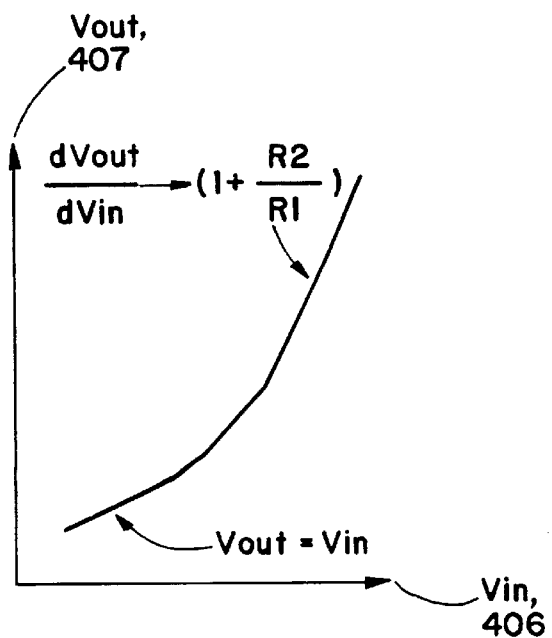

FIG. 23A shows the voltage to voltage transfer function of the analog linearizer of FIG. 23. At low voltages the gain is unity, while at higher voltages the gain approaches 1+R2/R1. At intermediate voltages the gain is concave up.

Figure 24:
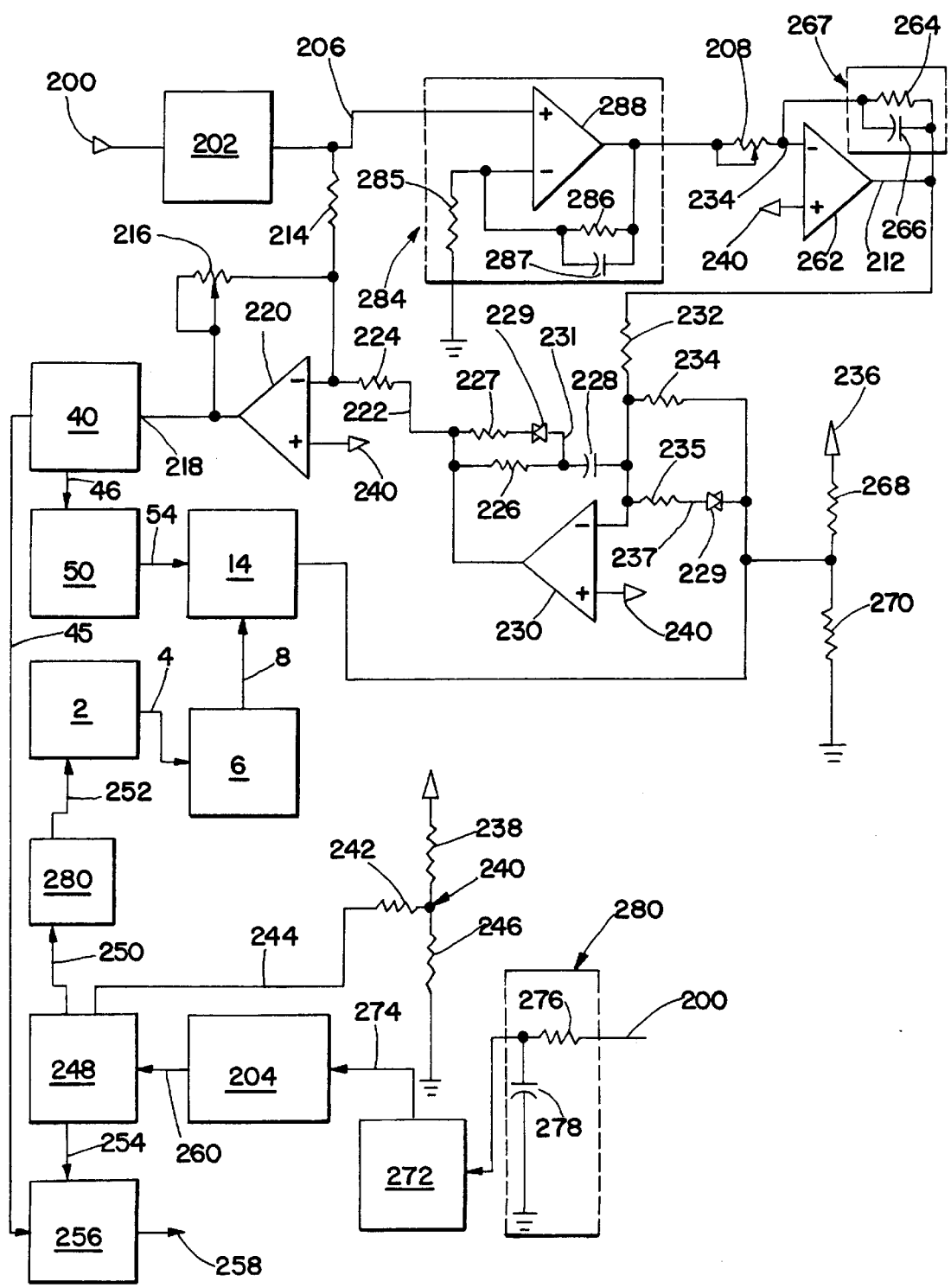

FIG. 24 shows the digitally calibrated and linearized form of the 3 point modulated transmitter that is the major invention herein. The digital calibration is applied to the VCO by means of a digital potentiometer controlled VCO gain trim. The linearization is applied to the voltage controlled crystal oscillator reference by a firmware controlled digital to analog converter (DAC). The calibration factors are stored in EEPROM for individual look up. The linearization accuracy is limited only by the quantization error of the digital potentiometer and DAC used, which by design can be limited to a negligibly small amount. The calibration may also be applied over temperature by use of an on system temperature sensor. More advanced calibrations such as of variable VCO current that may be used in transmit power control are also convenient.

Figure 25:
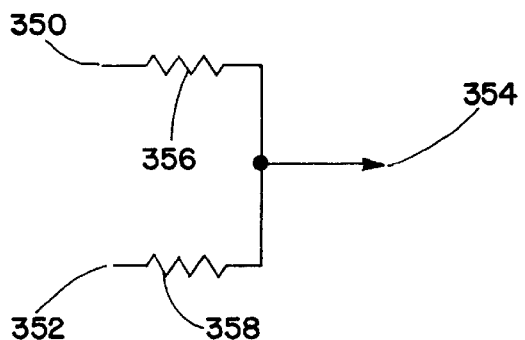

FIG. 25 shows correctly implemented "midpoint" modulation by means of a second signal NowMod* that cancels the initial DC content of the applied modulation. Midpoint modulation eliminates a transient response to the initiation of modulation by beginning the modulation from the carrier and deviating only out to the desired peak modulation. The "second signal" method is convenient when a processor signal is available to be assigned for this function. The need for midpoint modulation seems to escape many designers, as evidenced by numerous commercial designs that stiffer a "modulation turn on transient" that requires tens to hundreds of bits before valid data can be demodulated. Despite the simplicity of the circuit shown, the second signal midpoint method is non-obvious, as evidenced by the successful patenting of the simplified but lower performance AC coupled method of Chadwick (1996) as an improvement over the more complex DC capable method patented by Takaki (1986).

Figure 25A:
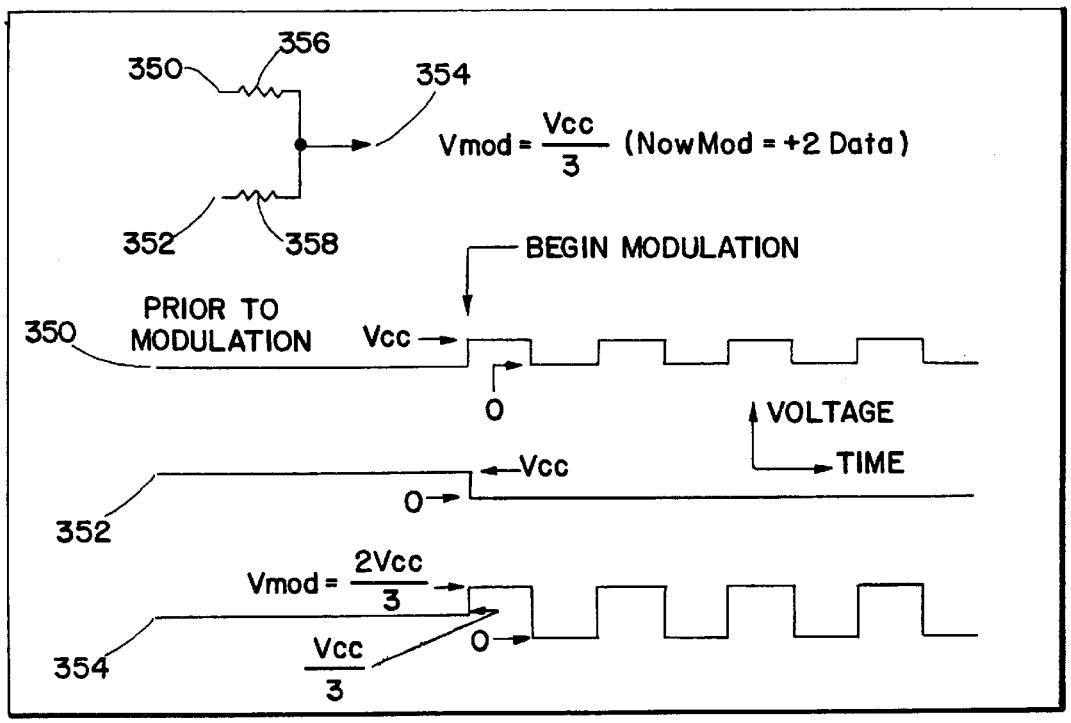

FIG. 25A shows the waveforms involved in the circuit of FIG. 25. The input signal Data swings from 0 to VCC, thus introducing the undesired DC offset. The NowMod* signal is summed with Data to produce the output signal Vmod that begins at the "midpoint" (of the resulting output swing) of Vcc/3 and swings equally between 0 and 2 Vcc/3.

Figure 26:
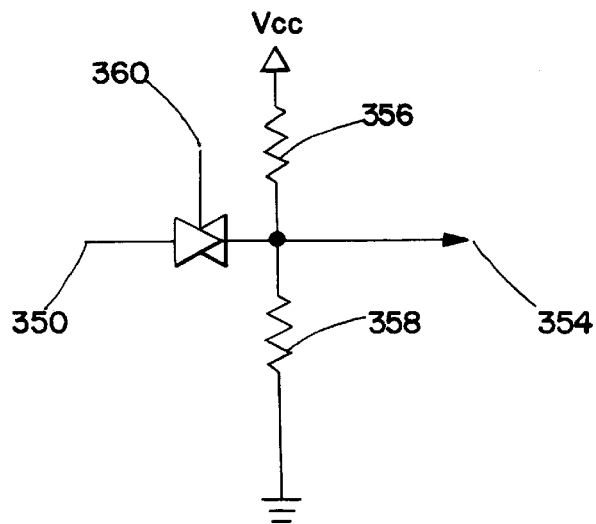

FIG. 26 shows a second and preferred method of attaining midpoint modulation using a buffer capable of a high impedance "open" mode and low impedance "drive" mode, along with a bias string to provide the midpoint bias voltage (typically at the actual midpoint of Vcc/2). This circuit allows forcing the initiation of modulation from the center of the modulation voltage range instead of from one end by entering the low impedance drive mode only at the initiation of modulation. Here an electronic analog switch is shown to provide the high impedance (effectively open) state for the buffer when not modulating. If a processor signal is available that has a high impedance mode, thus eliminating the analog switch, then this "switching" method allows the simplest fully DC capable mode of midpoint modulation possible.

Figure 26A:
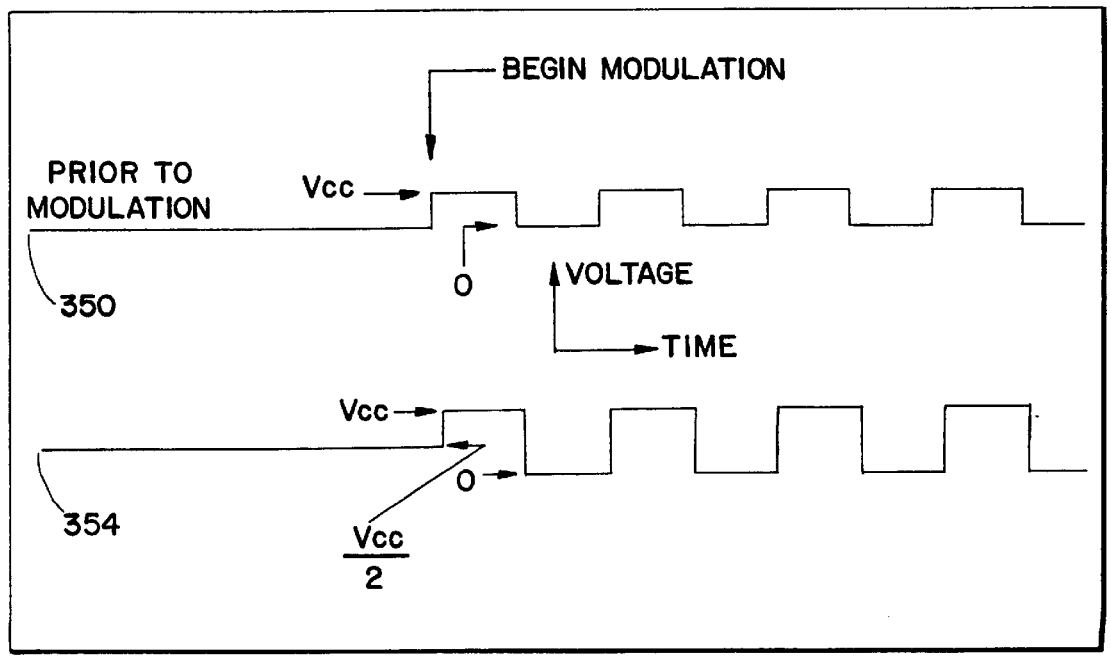

FIG. 26A shows the resulting waveforms for the switching method of midpoint modulation.

Figure 27:
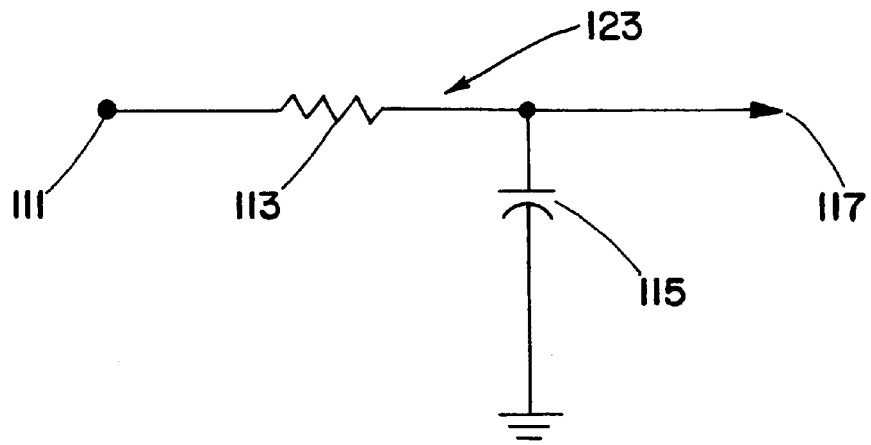

FIG. 27 shows a first order RC low pass filter that under some conditions may substitute for the active bypassed correcting integrator in the two point correcting integrator or three point modulation forms. This method has the capability, depending on circuit design details, of eliminating the operational amplifier used in the bypassed integrator form.

Figure 27A:
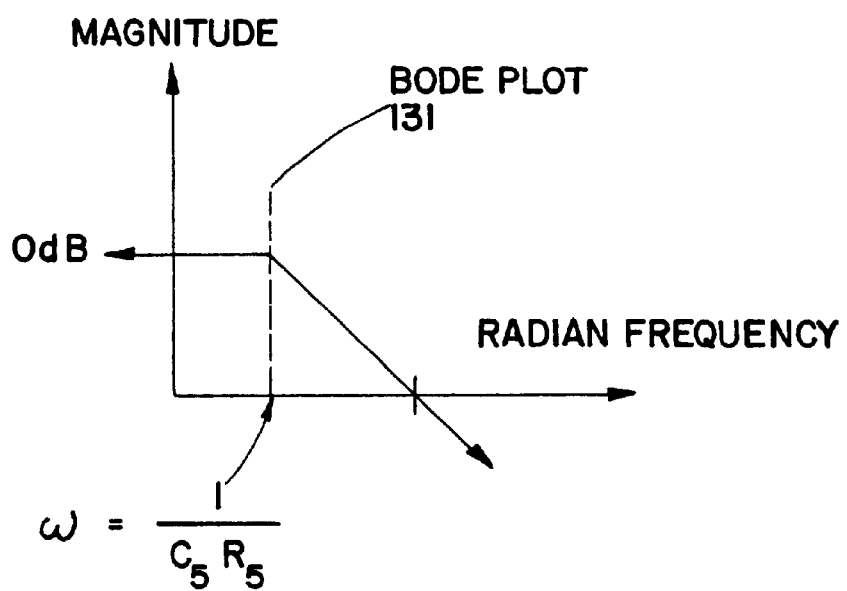

FIG. 27A shows the magnitude Bode plot of the first order RC low pass filter of FIG. 27. Note it has the same basic shape as the bypassed integrator Bode plot of FIG. 17A.

Figure 28:
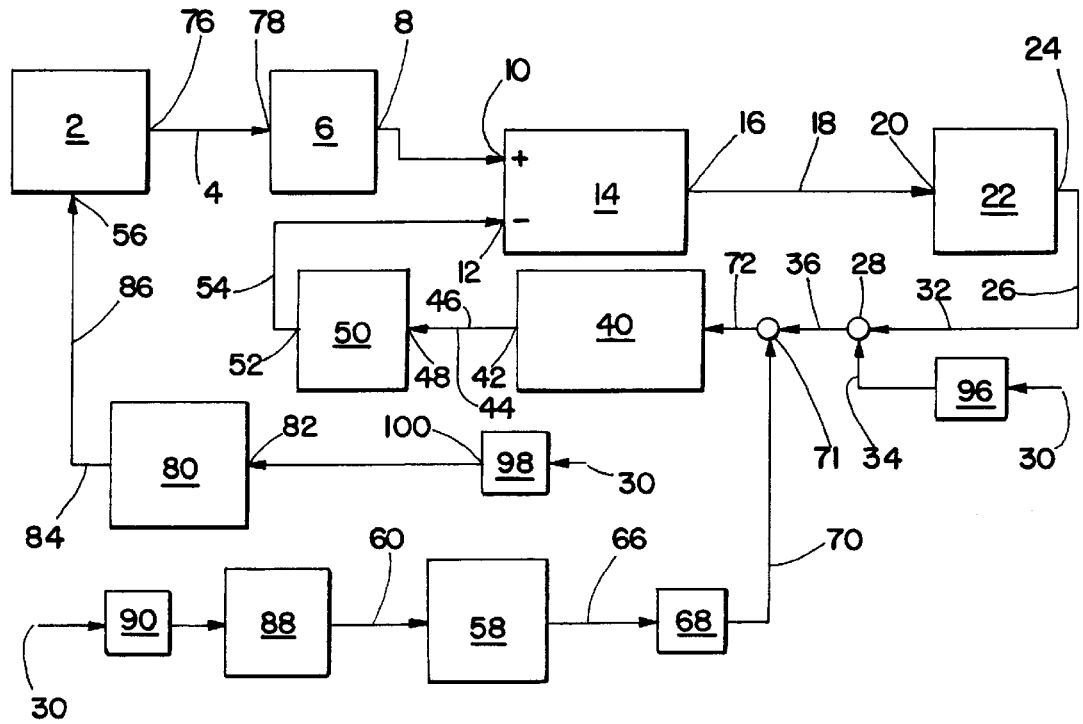

FIG. 28 shows an alternate form of three point modulation with correcting integrator summing on output side of loop filter as opposed to input side. This requires the addition of another filter function identical to the existing loop filter, except possibly for scaling differences elsewhere accounted for.

Figure 29:
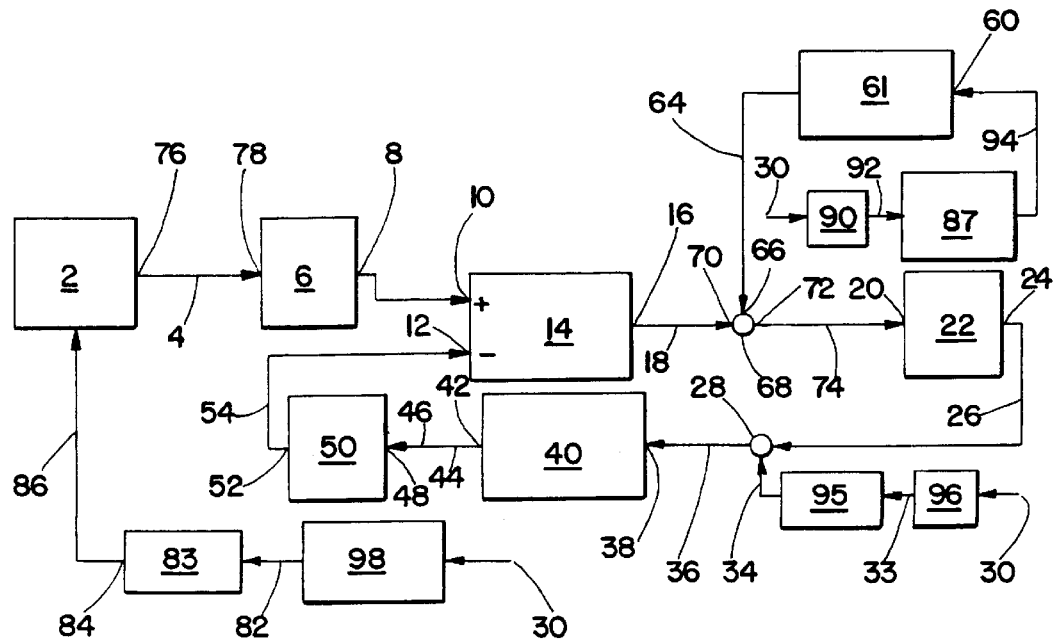

FIG. 29 shows the three point modulated phase locked loop synthesizer adapted for phase modulation instead of frequency modulation. Here the correcting integrator has been replaced with a correcting amplifier. To a first order the modulation of the reference for a phase modulated synthesizer is not needed, but in practice it has the advantage of reducing the phase error seen at the phase detector, and thus reducing the "sideband" levels produced during modulation.

DETAILED DESCRIPTION OF THE INVENTION

Before the present invention may be discussed in full detail, it is necessary to understand the fundamental operation of PLL synthesizers and how they have been frequency modulated prior to this invention. The method of analysis will first be discussed, followed by the behavior of the components within the PLL, and then the PLL itself. With the basic system and its analysis established, modulation may be discussed and the invention presented. Although the terms "voltage controlled oscillator" or VCO, and "voltage controlled crystal oscillator", or VCXO, shall be used for convenience in the following presentation since voltage is normally the control variable in common practice, it is understood that current can be the control variable, or that any other form of electronically controlled oscillators could be substituted. The invention disclosed is independent of the oscillator control variable.

Please refer to FIG. 1 in the following presentation. In concept the PLL is a fairly simple control system that forces a voltage controlled oscillator (VCO) 40 output frequency ($\omega_{out}$) 46 to be an exact multiple of a reference frequency ($\omega_{ref}$) 3. The reference frequency ($\omega_{ref}$) 3 is usually obtained from a crystal oscillator reference, usually a voltage controlled crystal oscillator (VCXO) 2, and further using reference divider 6 which divides by an integer M to generate a desired divided frequency and phase output, shown in FIG. 1 as phase output ($\theta_{ref}/M$) 56. In a control systems sense, the VCO 40 functions as an integrator from VCO input voltage (Uv) 36 to VCO output phase ($\theta_{out}$) 44. It is the output of this "integrator" that is controlled, and because frequency is by definition the time derivative of phase, the frequency is also controlled. The output frequency ($\omega_{out}$) 46 is forced to be $N\omega_{ref}/M$, where N is the divisor of radio frequency (RF) frequency divider block 50. Both M and N are usually variable under software control in order to allow control of frequency, though in practice in a given system M is usually programmed to a chosen value and N varied to tune over frequency. This allows stepping the output frequency in multiples of $\omega_{ref}/M$, which is often referred to as the "channel step".

Figure 1:
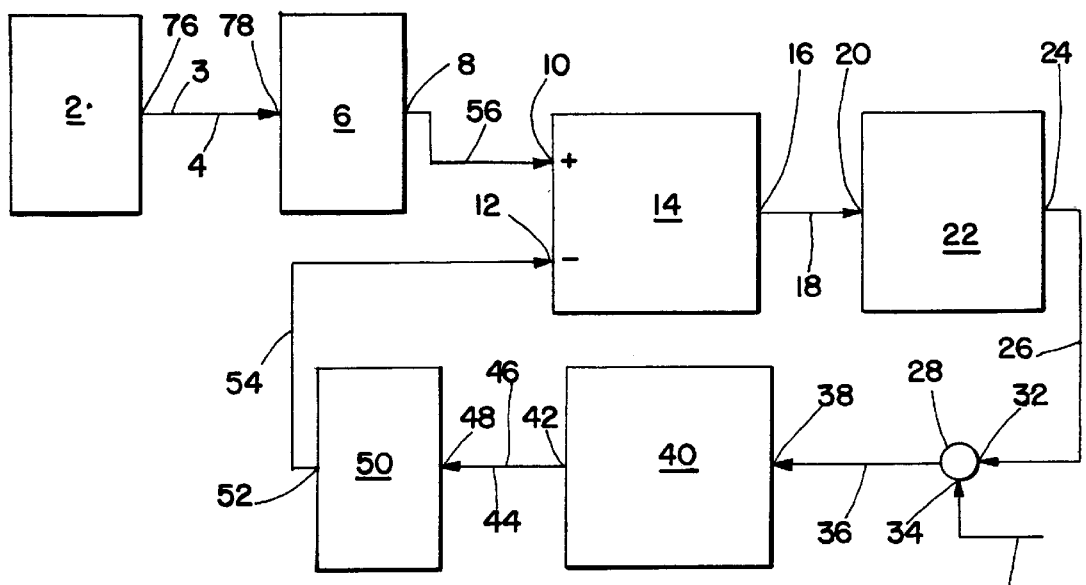
FIG. 1 is a block diagram of the basic prior art Phase Locked Loop (PLL) synthesizer, also showing how modulation may be summed into the loop. The PLL is basically a negative feedback control system where the phase of a signal that is divided down from a voltage controlled oscillator is kept equal to the phase of a signal that is divided down from a reference oscillator. Controlling phase also controls frequency.

In FIG. 1, the loop filter 22 is able to deliver whatever output voltage is needed to support the desired operating frequency. If the system is not "in lock", meaning there is substantial difference between the voltages on phase detector positive and negative inputs, 10 and 12, respectively, then there will be some output provided as phase detector output signal (Ud) 18 on phase detector output port 16. Phase detector output signal (Ud) 18 is provided to loop filter input 20 of integrating type loop filter 22. Loop filter output (Uf) 26 is inputted to VCO input summing node 28 at summing node first input 32 and summed with modulating signal (Vm) 30 applied to summing node second input 34. This results in summing node output signal (Uv) 36 which is applied to VCO voltage input control terminal 38. Loop filter output (Uf) 24 changed in the appropriate direction to change the VCO 40 frequency output ($\omega_{out}$) 46 and phase output ($\theta_{out}$) 44 such that the system is brought in lock. For an infinite DC gain (integrating) loop filter 22, the in lock condition will be characterized by zero phase error, meaning that phase detector positive input 10 and negative input 12 will be perfectly matched and phase detector output (Ud) 18 will be zero. When modulation is applied by (Vm) 30, then the carrier will be modulated about the center frequency given by $N\omega_{ref}/M$, except that the modulation will be distorted by the system sensing the modulation as error and applying corrective feedback. The degree of the distortion will be a function of the loop bandwidth and the low frequency content of the applied modulation.

Figure 2:
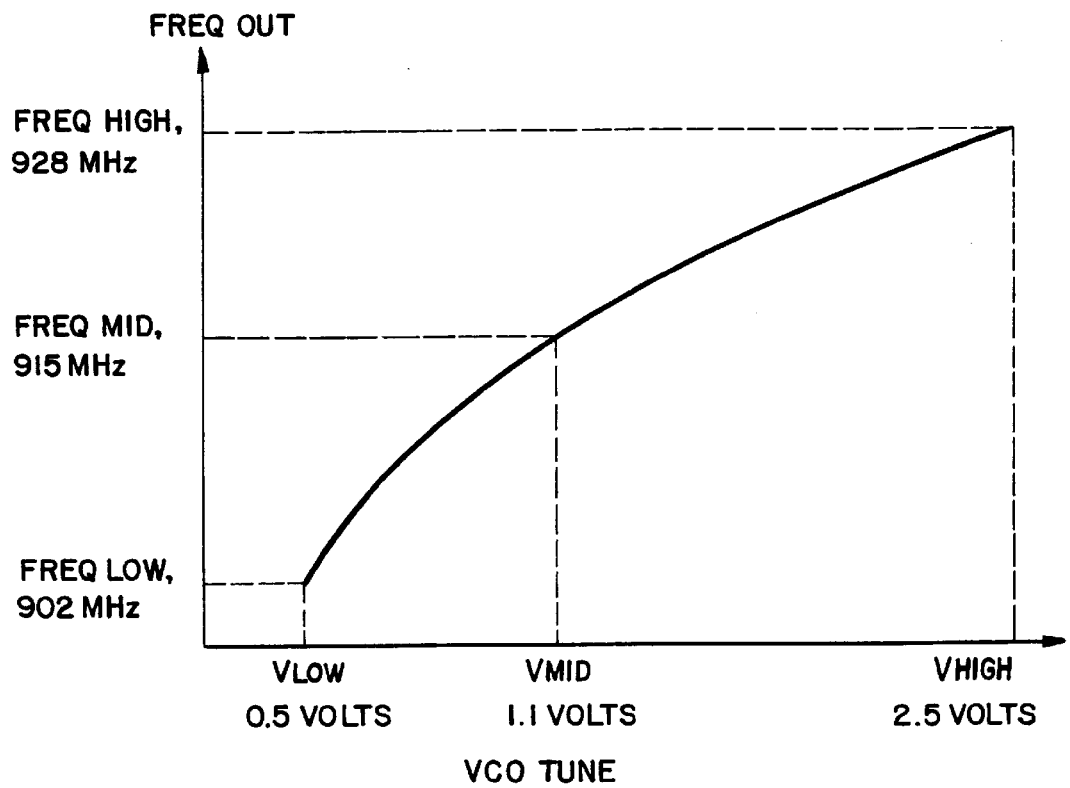
FIG. 2 displays a typical Voltage Controlled Oscillator (VCO) tune curve, depicting the troublesome nonlinearity inherent in these subsystems. The frequency range depicted is the 902 to 928 MHz Industrial, Scientific, and Medical (ISM) band, but other frequency ranges apply also. The voltage range shown in 0.5 to 2.5 volts, in keeping with a typical low power design requirement to function with a 3 volt supply.

Referring now to FIG. 2 there is shown a "tune curve" of a typical VCO 40. VCO frequency output ($\omega_{out}$) 46 is shown as a nonlinear function of VCO voltage input (Uv) 36. In seeking the desired carrier frequency, the PLL hunts the exact point on this curve where the desired frequency is forced to occur, limited only by the accuracy of the frequency reference. Mild nonlinearity in the tune curve is not a problem in locking at the desired frequency, but will be a problem that must be addressed in extending the PLL to be frequency modulatable. The "linearity" of the VCO may be defined as the slope in frequency units per volt at the steepest point divided by the slope at the shallowest point, over the band of interest. A perfect VCO would therefore exhibit a linearity of 1.0. For a fairly narrow tuning frequency application, such as the 902 to 928 MHz Industrial, Scientific, and Medical (ISM) band, a typical linearity would be 1.5 to 2.5 with a low voltage supply such as 3 volts. Unless the VCO is "linearized", this would result in a proportional variation of the frequency deviation imposed by a constant peak modulation voltage.

Figure 3:
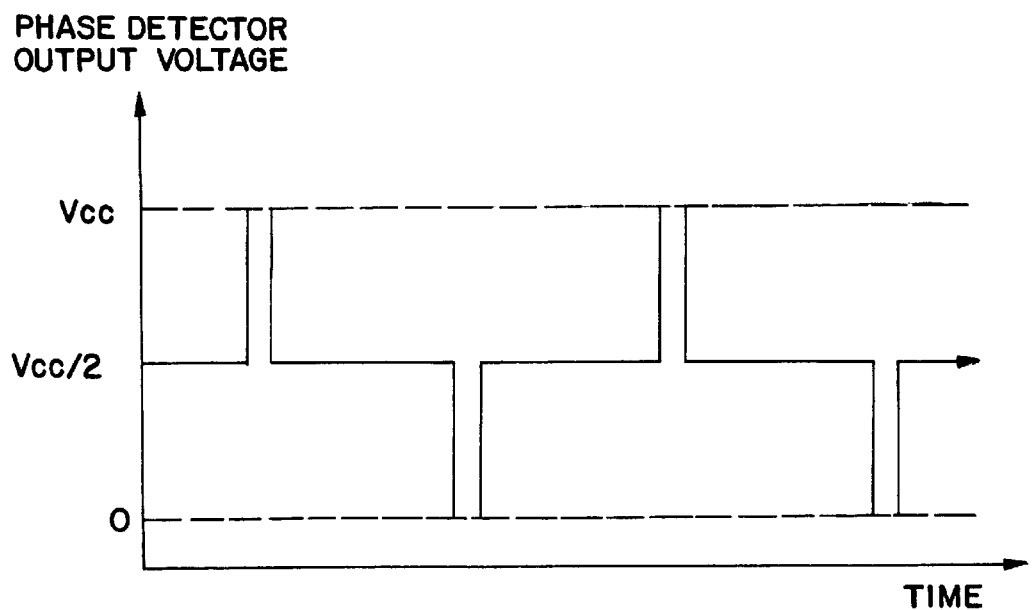
FIG. 3 displays the time domain behavior of the typical digital phase detector over sample period T. Phase error from $-2\pi$ to $+2\pi$ radians is encoded as pulse width from $-T/2$ to $+T/2$, where the frequency of the pulses equals the stepping frequency of the synthesizer. These pulses are low pass filtered to give an analog voltage representative of phase error. When encoded in voltage form in a single supply system, the zero phase error level following low pass filtering is the midpoint of the maximum voltage level.

FIG. 3 shows the time domain output of the phase detector 14 of FIG. 1. Though here shown in voltage form, in modern synthesizers the phase detector 14 is usually a digital circuit that simply provides a current pulse of width equal to the time difference between digital edges provided on phase detector positive input 10 and negative input 12 by the divided VCO output 54 and the divided reference 56. In the locked state these digital edges are normally aligned in time, so the phase detector output (Ud) 18 is current pulse approaching zero width. The current drives the normally passive loop filter 22, whose output (Uf) 26 is normally (in the absence of the need for modulation) the VCO steering voltage. This combination of a current output phase detector 14 driving a passive loop filter 22 allows a circuit efficient implementation of an integrating type of loop filter normally referred to as a "charge pump". The integrating DC character of a charge pump allows any VCO steering voltage (Uf) 26 to be supported by a steady state zero phase error, as the necessary VCO steering voltage (Uf) 26 is arrived at during the settling process when phase error is nonzero. This zero phase error final state allows the phase detector output (Ud) 18 to settle at a near zero width, which has the important character of a low amplitude component at the channel step or "sampling" frequency. This low amplitude of energy at the sampling frequency results in low "sidebands", which are undesired spurious products grouped around the carrier frequency and offset from the carrier at multiples of the sampling frequency. The phase detector 14 normally has a maximum pulse width equal to the period of the channel step frequency before the encoding at one sample interval encroaches into the next sample interval. This corresponds to an encoded phase range of $2\pi$, so the fact that the current can pump up or down gives a maximum encoded phase range of $-2\pi$ to $+2\pi$. If the phase detector output (Ud) 18 is in voltage form with maximum voltage Vcc, then the "gain" (Kd) of the detector in volts/radian is the maximum output voltage variation from the system ground, or artificial ground in the case of single supply systems, of the phase detector 14 divided by the $2\pi$ radians of a full cycle. Thus it is given by Vcc/$4\pi$ for a single supply system where the artificial ground is at mid supply. An important feature of modem digital phase detectors is that if the encodable range of $+/-2\pi$ is exceeded, the phase detector 14 reverts to a nonlinear but monotonic frequency detector mode. This pulls the VCO 40 back towards the desired range until phase lock is again acquired.

Figure 4:
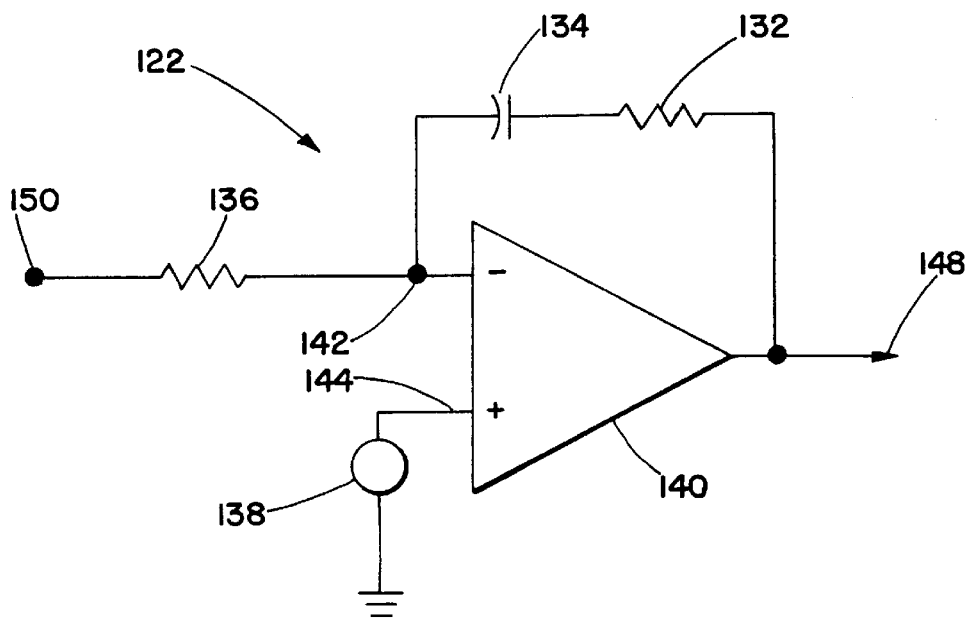
FIG. 4 is a typical low pass active loop filter circuit. When used with the digital phase detector of FIG. 3, Vref 138 is the voltage representing zero phase error.
Figure 4A:
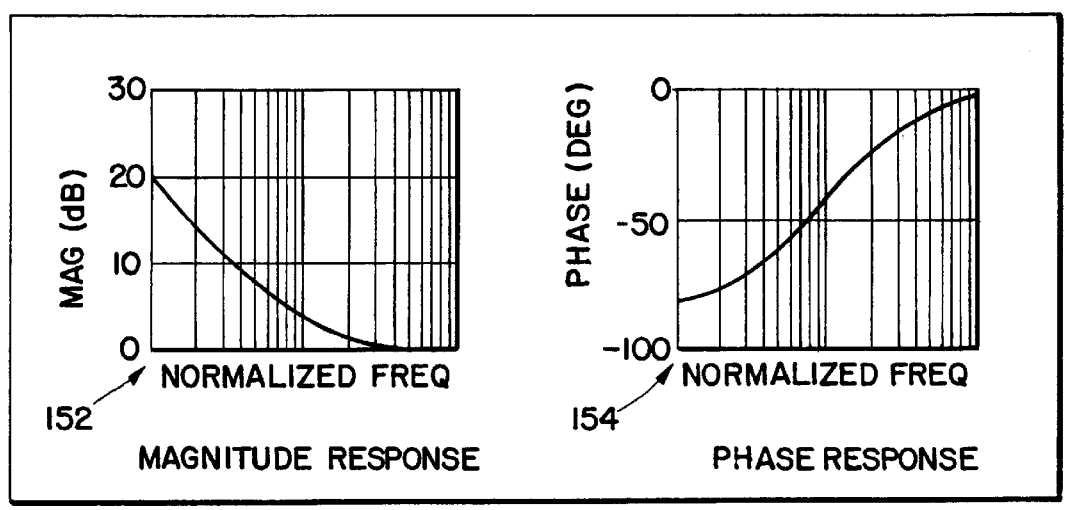
FIG. 4A is the transfer function of the loop filter circuit of FIG. 4 with the two time constants both normalized to 1.0. Note that the DC magnitude response approaches infinite gain in the manner of an integrator. The phase response is at $-90$ degrees at low frequencies, like an integrator, but comes back towards zero at high frequency. This phase behavior was designed into the circuit of FIG. 4 to ensure stability of the PLL.

A typical active loop filter 122 is shown in FIG. 4. This operational amplifier 140 based circuit is an integrator to which resistor R2 132 has been added in order to prevent excess phase shift that would cause instability. Normally an integrator has 90 degrees of phase lag, but at high frequencies resistor R2 132 forces the circuit to act in an amplifier mode with phase lag approaching zero as frequency increases. This is sometimes referred to as a "lead-lag network". This phase compensation may be designed to provide a desired loop phase margin, thus forcing system stability. This circuit has infinite DC gain for an ideal operational amplifier 140, which is key to forcing tracking phase error to zero, so that the pulse width of the phase detector 14 pulses shown in FIG. 3 may approach zero in steady state lock. The magnitude and phase Bode plots of this loop filter are shown in FIG. 4A. The loop filter transfer function (F(s)) is given in Eq. (1) below.

$$F(s) = \frac{-(1 + s\tau_2)}{s\tau_1} \qquad \text{Eq. (1)}$$

where $$\tau_1 = R_1 C_1 \qquad \text{Eq. (2)}$$

and $$\tau_2 = R_2 C_1 \qquad \text{Eq. (3)}$$

In PLL analysis, the steady state output (carrier) may be viewed as a DC operating point, and local variations in frequency and phase viewed as "small signal" behavior around this operating point. The analysis may be carried out in the frequency domain, where "s" is the common complex frequency variable used in electrical engineering, and is given by s=$\sigma$+j$\omega$, where "sigma" is the real part, "j" is the square root of negative one, and "omega" is the radian frequency. This is the same concept as small signal variation in an amplifier, except that the analysis views frequency variation in the frequency domain instead of the more common case of voltage variation in the frequency domain.

Several PLL transfer functions are of interest. The phase transfer function H(s) is defined as:

$$H(s) = \frac{\theta_{out}/N}{\theta_{ref}/M} \qquad \text{Eq. (4)}$$

The phase transfer function (H(s)) determines how well the phase of the divided VCO output 54 tracks the phase of the divided reference 56. It may be obtained in terms of specific loop variables by algebraically solving for it in terms of the relationships defined in FIG. 1. The result is:

$$H(s) = \frac{K_d K_o F(S)}{Ns + K_d K_o F(S)} \qquad \text{Eq. (5)}$$

Note that Eq. (5) shows the phase transfer function H(s) to be inherently low pass, as would be expected for a negative feedback tracking control system.

In control systems analysis, and particularly for second order control systems, a standard normalized form for the expression of transfer functions and time domain responses has evolved. Use of this form is extremely convenient for the design of the standard second order PLL, but the common references do not discuss its application to the FM PLL. However, the normalized form is easily extendable to the FM PLL, and leads directly to the development of a straightforward design procedure.

Eq. (5) may be placed into normalized form when an explicit form is substituted for the loop filter transfer function F(s). For frequency synthesis applications, the most common filter form is the "type 3" active filter, as shown in FIG. 4 and described in Eqs. (1)–(3). It is common in the literature to ignore the negative sign in Eq. (1) and introduce the negative feedback at the phase detector. Dropping the negative sign and substituting Eq. (1) into Eq. (5) yields $$H(s) = \frac{\frac{K_0 K_d}{\tau_1 N}(1+\tau_2 s)}{s^2 + \frac{K_0 K_d \tau_2}{\tau_1 N}s + \frac{K_0 K_d}{\tau_1 N}} \qquad \text{Eq. (6)}$$

The equation may now be converted to the normalized form. In control theory, the standard normalized form of a second order equation is written as:

$$\text{Form} = s^2 + 2\zeta\omega_n s + \omega_n^2 \qquad \text{Eq. (7)}$$

In Eq. (7), $\zeta$ is referred to as the damping factor, and $\omega_n$ as the natural frequency. Equating coefficients between this equation and the denominator of Eq. (6) shows that the denominator can be expressed in normalized form if the following definitions are made:

$$\omega_n = \sqrt{\frac{K_0 K_d}{\tau_1 N}} \qquad \text{Eq. (8a)}$$

$$\zeta = \frac{\tau_2 \omega_n}{2} \qquad \text{Eq. (8b)}$$

The term $\omega_n$ is known as the loop "natural frequency", normally expressed in units of radians/sec, though it may be expressed in Hertz as well so long as it is understood that the factor of $2\pi$ must be taken into account in calculations. Often the term "loop bandwidth" is used for natural frequency, though actually the unity gain loop bandwidth is $\omega_n\sqrt{2}$. The term $\zeta$ is known as the loop "damping factor", and is a measure of loop phase margin and stability. Larger $\zeta$ implies more stability, or phase margin.

Substituting Eq. (8a) and Eq. (8b) into Eq. (6) yields:

$$H(s) = \frac{2\zeta\omega_n s + \omega_n^2}{s^2 + 2\zeta\omega_n s + \omega_n^2} \qquad \text{Eq. (9)}$$

Figure 5:
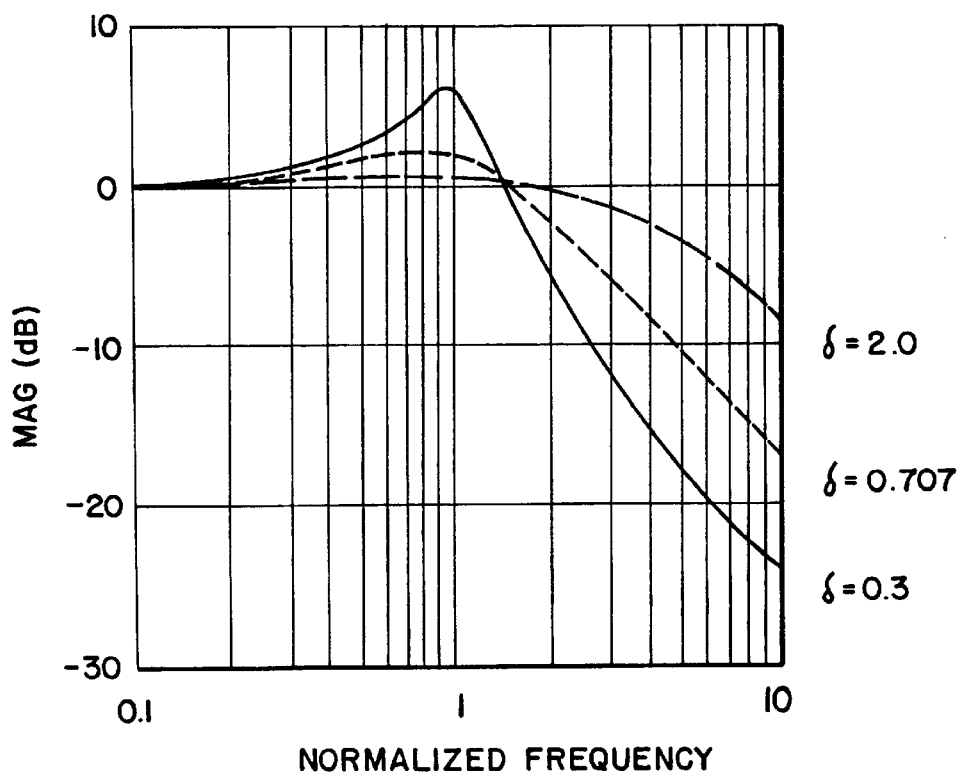
FIG. 5 is the graphed phase transfer function of the $2^{nd}$ order phase locked loop with the natural frequency normalized to 1.0, shown over several values of the loop damping factor $\zeta$. The phase transfer function is defined as the transfer function from the divided reference input to the divided VCO input of the phase detector, and thus represents the tracking behavior of the loop. Note that the function is inherently low pass in character, and that the function peaks near $\omega_n=1.0$. The loop bandwidth is defined as the unity gain crossover point of this transfer function, which is always at $\sqrt{2}*\omega_n$. This definition of loop bandwidth was made instead of the more common $-3$ dB point because curves of the phase transfer function for all values of $\zeta$ pass through the $\sqrt{2}*\omega_n$ point.

This function is plotted in FIG. 5. The normalized phase transfer function (H(s)), showing low pass character, is plotted over several values of damping factor ($\zeta$). The point 1.0 on the frequency scale is the normalized natural frequency. The loop bandwidth is $\sqrt{2}$ times the natural frequency ($\omega_n$), though these terms are sometimes used interchangeably. The case $\zeta<1$ is referred to as underdamped, the case $\zeta>1$ as overdamped, and the case $\zeta=1$ as critically damped. The case $\zeta=\sqrt{2}/2=0.707$ is the most common design choice. It affords the fastest recovery from transient conditions, and is near optimal for loop suppression of oscillator noise.

Another important transfer function is the error transfer function $H_e(s)$, defined as:

$$H_e(s) = \frac{\frac{\theta_{ref}}{M} - \frac{\theta_{out}}{N}}{\frac{\theta_{ref}}{M}} \qquad \text{Eq. (10)}$$

Solving for this function form the relations defined in FIG. 1 and converting to normalized form gives:

$$H_e(s) = \frac{s^2}{s^2 + 2\zeta\omega_n s + \omega_n^2} \qquad \text{Eq. (11)}$$

Figure 6:
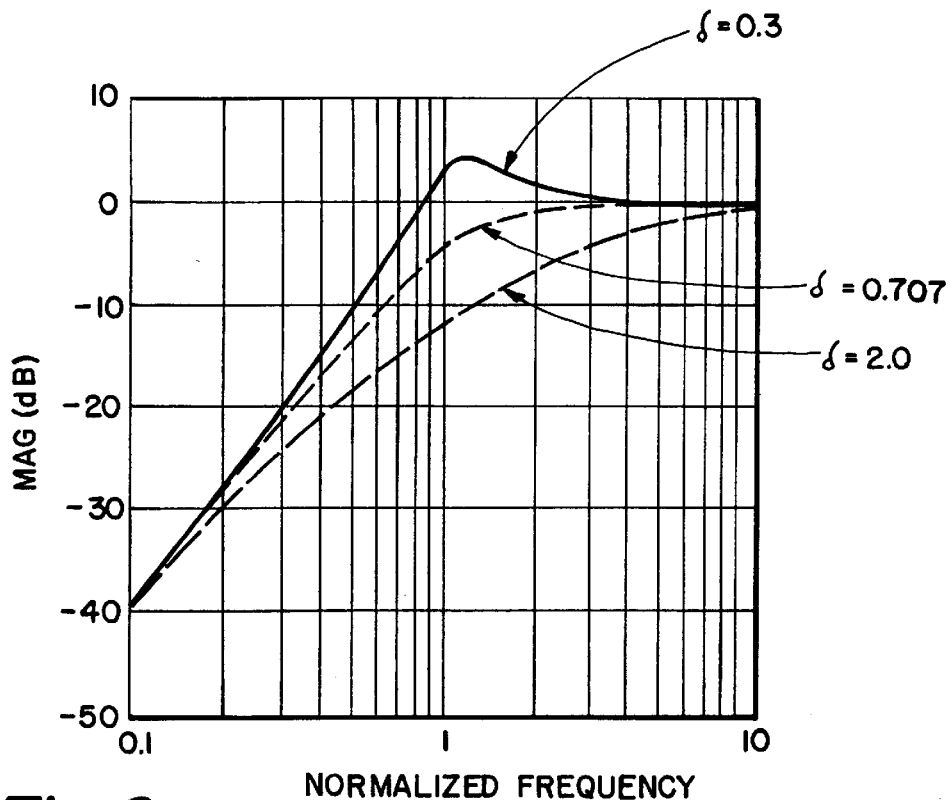
FIG. 6 is the error transfer function of the $2^{nd}$ order phase locked loop with the natural frequency normalized to 1.0, shown with several values of damping factor. This function is defined as the transfer function from the divided reference input to the divided reference input minus the divided VCO input to the phase detector. It represents the loop suppression of phase error over frequency. Note this function is inherently high pass in character, indicating that the loop does not allow error at low frequencies within its loop bandwidth. It is shown in the MSEE thesis "New Approach to Frequency Modulated Frequency Synthesis", F. Dacus, University of Texas at Arlington, May, 1990, the disclosure of which is hereby incorporated by reference, that the transfer function of modulation signal Vm 30 of FIG. 1 to output frequency deviation is given by the VCO gain Ko times the error transfer function. This new transfer function is defined as the frequency modulation transfer function of the uncompensated phase locked loop.

Note that the error transfer function $H_e(s)$ is generally high pass, so that significant phase error is only allowed to exist above the loop bandwidth. A family of error transfer curves for this function is shown in FIG. 6.

The normalized form may be applied to the analysis of the FM PLL. Because modulation to the PLL is only applied in the locked condition, the analysis is of small signal quantities. Analysis will first be presented for the uncompensated PLL, then for the two forms of two point modulation, then for the present invention of three point modulation.

The one point modulated uncompensated PLL is the simplest modulated PLL case. A modulating signal Vm 30 is summed into the VCO steering voltage (Uf) 26 to frequency modulate the carrier around the lock frequency. We are critically interested in the transfer function from the modulating signal (Vm) 30 to the VCO output frequency ($\omega_{out}$) 46 variation, which may be defined as the frequency modulation transfer function $H_{fm}(s)$. This new function is mathematically defined in Eq. (12) below.

$$H_{fm} = \frac{\omega_{out}}{V_m} \qquad \text{Eq. (12)}$$

Small signal quantities are implied in this equation. Note that for modulation purposes it is desired that the VCO 40 act as if it is open loop, meaning that there should be zero response to the modulation fed back by the PLL. In this ideal desired case $H_{fm}=K_o$.

Since the reference frequency is fixed in the uncompensated FM PLL system, the small signal component of the reference signal is zero. Solving for the function Eq. (12) from the relations defined in FIG. 1, substituting the active loop filter form of Eq. (1), and applying the normalized form substitutions of Eq. (8a) and Eq. (8b) yields:

$$H_{fm}(s) = \frac{K_0 s^2}{s^2 + 2\zeta\omega_n s + \omega_n^2} = K_0 H_e(s) \qquad \text{Eq. (13)}$$

Like phase error, the uncompensated phase locked loop will only allow modulation to exist well above the loop bandwidth. The effect of $\omega_n$ and $\zeta$ may be further clarified by the definition of a new figure of merit for the modulated PLL, the signal to distortion ratio (SDR) function. The definition is arrived at by noting that the ideal frequency modulation transfer function is simply $K_o$. Any loop modifications to this are undesired, and all such modifications appear in the loop filter output (Uf) 26, so a signal to distortion ratio transfer function SDR(s) may be defined as:

$$SDR(s) = \left| \frac{V_m(s)}{U_f(s)} \right|$$ Eq. (14)

Solving for the signal to distortion transfer function SDR(s) and comparing to the phase transfer function (H(s)) shows that:

$$SDR(s) = \left| \frac{1}{H(s)} \right|$$ Eq. (15)

Figure 7:
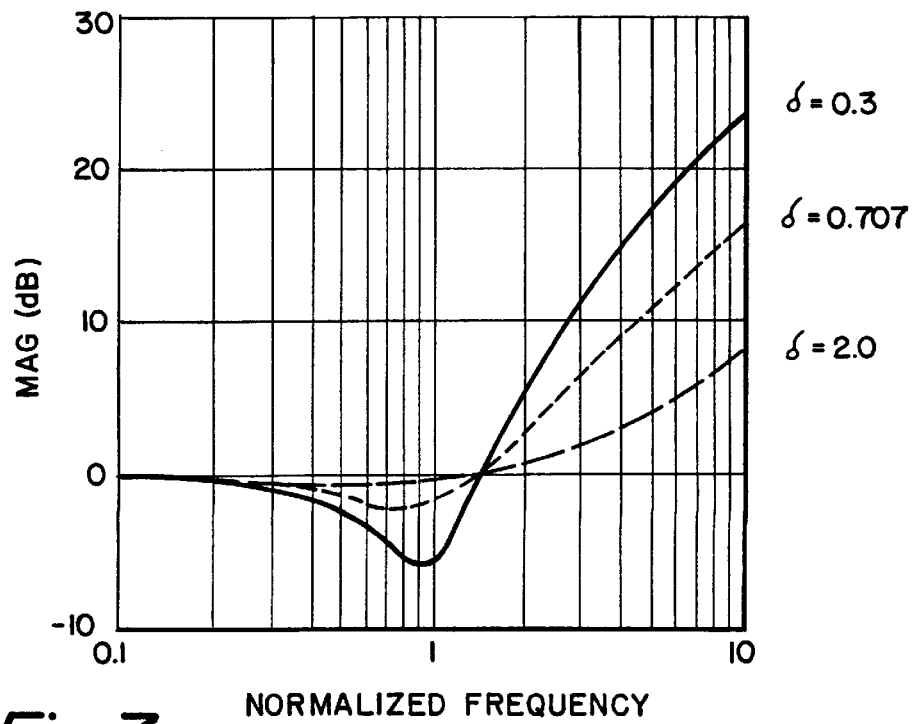
FIG. 7 is the signal to distortion ratio function of the $2^{nd}$ order phase locked loop with natural frequency normalized to 1.0. This function is the reciprocal of the phase transfer function and gives the value of the signal to distortion ratio of applied modulation as a function of the frequency of the modulation. This quantity is not defined in the common literature, and is first defined and derived in the Dacus thesis referenced above.

A set of curves depicting the signal to distortion ratio (SDR) of an uncompensated PLL is shown in FIG. 7. Since the signal to distortion ratio (SDR) may be visualized as an upside down graph of H(s), the effects of $\omega_n$ and $\zeta$ are clear. As expected, for any modulating frequency above a set of candidate bandwidths, a smaller $\omega_n$ gives better signal to distortion ratio (SDR) at any frequency above the loop bandwidth. However, it is also noted that for modulating frequencies above the loop bandwidth better signal to distortion ratio (SDR) is attained for smaller $\zeta$. This improvement only applies, though, if all frequency components of the modulating signal (Vm) 30 are above the loop bandwidth $\omega_n\sqrt{2}$. Components verging into the loop bandwidth would be worsened by lower values of $\zeta$. With a typical damping factor $\zeta$ of 0.707, the modulation frequency must be 10 or more times the loop bandwidth before the signal to distortion ratio (SDR) reaches acceptable values greater than 15 dB.

Figure 8:
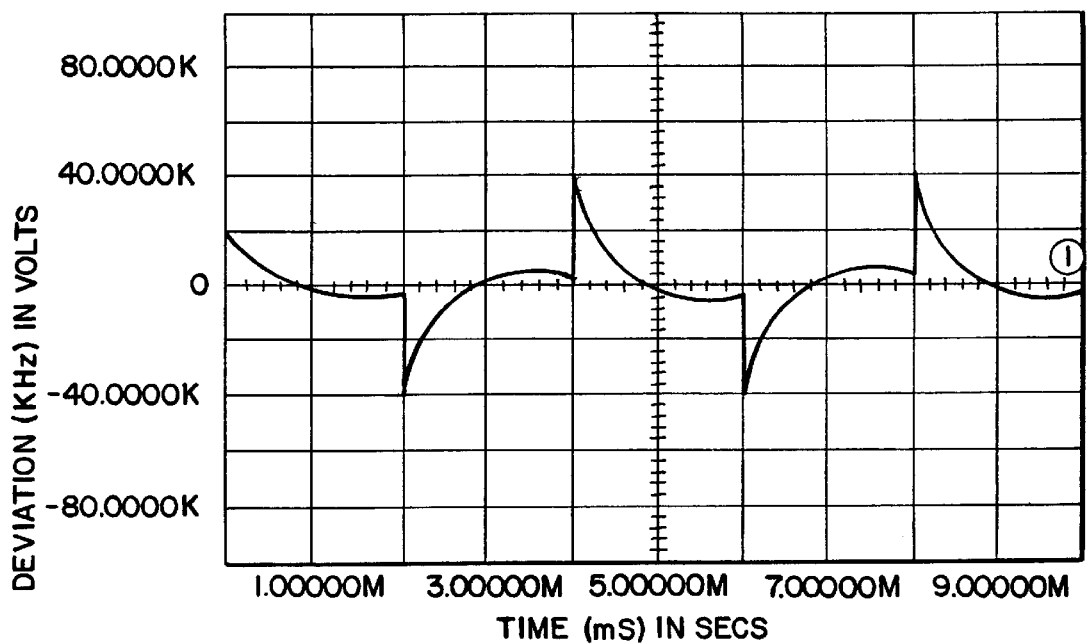
FIG. 8 is the time domain behavior of the frequency modulation of the uncompensated modulated PLL (obtained via SPICE circuit simulation) of FIG. 1, displaying the severe distortion that occurs when the modulating frequency is equal to the loop natural frequency. In the graph shown and in all the subsequent time domain graphs the loop natural frequency is 250 Hz, and the loop bandwidth $=250\sqrt{2}=354$ Hz.
Figure 9:
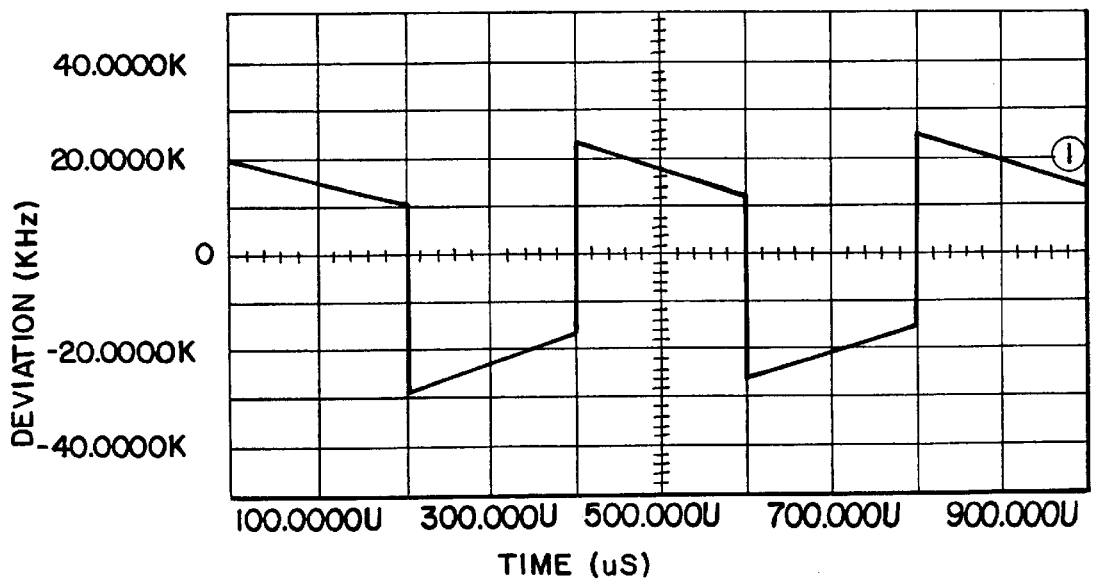
FIG. 9 is the time domain behavior of the frequency modulation of the uncompensated PLL of FIG. 1, where the modulation frequency is ten times the loop natural frequency. Some references mistakenly report high quality modulation at this frequency separation, but it is apparent that the distortion is still significant. Here the modulation is a 2500 Hz square wave (5000 bits per second), and resulting signal to distortion ratio is about 16 dB. This illustrates the need for special design methods to modulate PLL's, even at frequencies well above the loop bandwidth.
Figure 10:
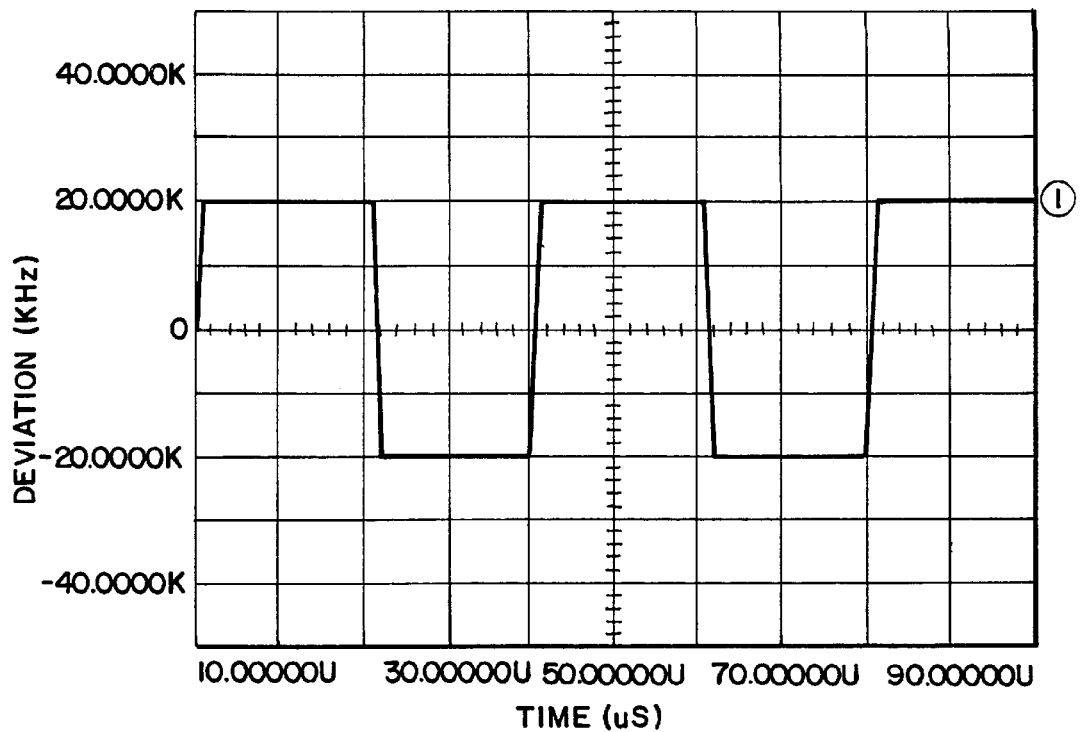
FIG. 10 is the time domain behavior of the frequency modulation of the uncompensated PLL of FIG. 1, where the modulation frequency is 100 times the loop natural frequency. The distortion is now quite low, but for several bits in a row of the same polarity distortion would still be noticeable.

The behavior of the uncompensated FM PLL is illustrated by SPICE circuit simulation outputs shown in FIGS. 8–10. SPICE is an acronym for "Simulation Program with Integrated Circuit Emphasis", and is the most prevalent analog circuit simulation program in professional use. In all these figures a digitally frequency modulated PLL is simulated at a carrier frequency of 915 MHz with typical subsystem values. The loop natural frequency $\omega_n$ is 250 Hz (or 1570 rad/sec), so loop bandwidth is $250\sqrt{2}=354$ Hz, and the desired frequency deviation is 40 KHz peak to peak. The damping factor $\zeta$ is 0.707. In FIG. 9 the modulation signal Vm 30 is a square wave at 250 Hz, equivalent to a bit rate of 500 bits/sec. The resulting distortion is too severe for the modulation to be used, since the loop transient response returns the modulation to zero before the next bit time. In FIG. 10 the modulating frequency has been increased to 2.5 KHz, or ten times the loop natural frequency. The signal to distortion ratio (SDR) is about 16 dB, which is in agreement with the signal to distortion ratio plot of FIG. 7. It is commonly assumed in numerous published literature that digital modulation at 10 times the loop natural frequency is sufficient separation to allow low distortion modulation. Here rigorous simulation with a bit rate of 20 times the loop natural frequency shows that loop response is still strongly distorting the desired shape. Only in FIG. 10, where the modulating frequency is 25 KHz, 100 times the loop bandwidth, is the distortion approaching negligible; but for more than a single zero or one bit in a row the distortion would be noticeable.

Referring now to FIG. 11, there is shown a block diagram of a frequency modulated PLL with the modulation simultaneously applied to both the VCXO 2 (or other controllable reference frequency source) and the VCO 40. The modulation signal (Vm) is summed into the VCO steering voltage (Uf) 26 at VCO summing node 28 and directly provides the desired modulation. The concept is for the modulation of the VCO 40 and the VCXO 2 to result in no change in the phase difference in the quantity where:

$$U_d = \frac{\theta_{out}}{N} - \frac{\theta_{ref}}{M}$$ Eq. (16)

In a small signal sense, it is desired for (Ud) 18 to be zero, which means there is no loop response to the applied modulation and thus no distortion. With (Ud) 18 equal zero, it immediately follows that $$\theta_{ref} = \frac{M}{N}\theta_{out}$$ Eq. (17)

Then because frequency is the derivative of phase with respect to time (by definition), $$\omega_{ref} = \frac{M}{N}\omega_{out}, \text{ which in turn implies}$$ Eq. (18)

$$K_{ox} = \frac{M}{N}K_o \text{ as a required design condition,}$$ Eq. (19)

where $K_{ox}$ is the gain of the VCXO 2 and $K_o$ is the gain of the VCO 40. When this condition is fulfilled, perfect modulation should result. If the voltage levels applied to modulate the VCXO 2 and VCO 40 are different, then the condition becomes $$K_{ox}V_{mx} = \frac{M}{N}K_oVm$$ Eq. (20)

where Vmx (not shown on FIG. 11) is the VCXO modulating signal applied to the VCXO 2 which is a differently scaled version of Vm 30, the modulating signal applied to the VCO 40.

This result may be confirmed as follows. Solving for $H_{fm}$ in terms of the relations defined in FIG. 11 gives:

$$H_{fm} = \frac{K_o\left(\frac{F(s)K_dK_{ox}}{sM} + 1\right)}{\frac{F(s)K_dK_o}{sN} + 1}$$ Eq. (21)

Note that if Eq. 19 is satisfied, then Eq. (21) will reduce to the ideal case of:

$$H_{fm} = \frac{\omega_{out}}{V_{in}} = K_0, \text{ as desired.}$$ Eq. (22)

Figure 12:
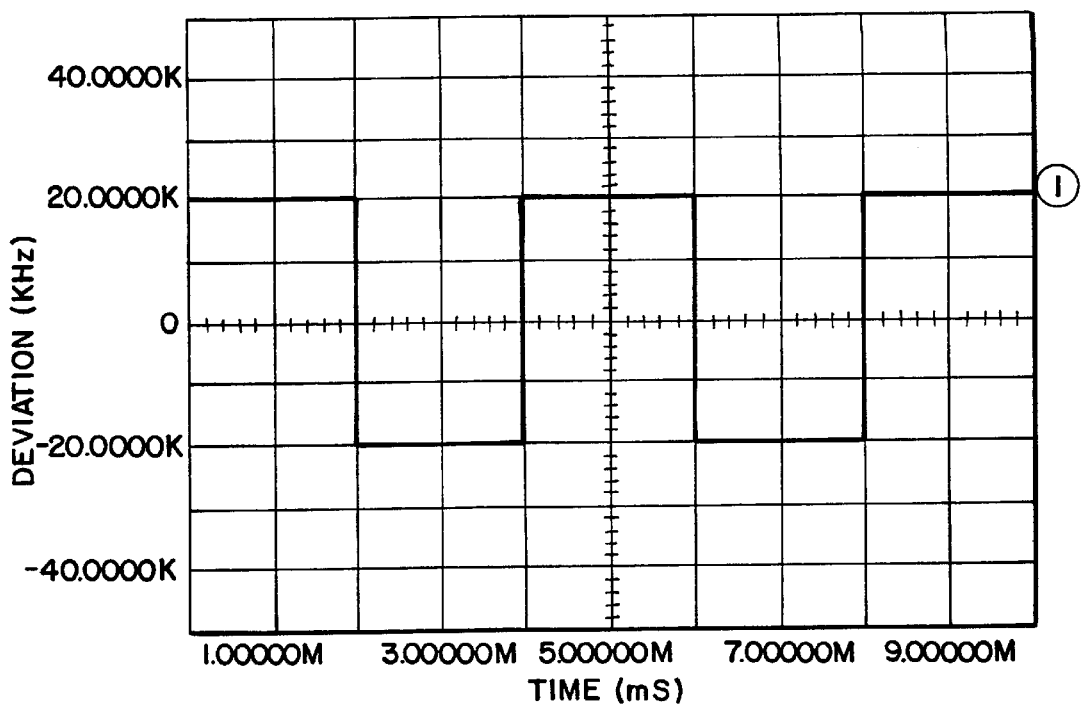
FIG. 12 is a SPICE simulation output displaying the perfect modulation resulting from the two point modulation of the reference frequency and the VCO of FIG. 11 that is attained in the ideal case of infinite reference frequency "modulation bandwidth", meaning the reference frequency modulation can track applied modulation with zero time lag.

This result is confirmed via time domain circuit simulation in FIG. 12, where perfect modulation results in the case of $K_{ox}$ being a constant that satisfies Eq. (19). However, such behavior is not possible for a real VCXO 2 reference. The crystals used in VCXO's are very narrow bandwidth (high Q) and there is a resulting rather low limit on the speed with which a VCXO 2 may follow a VCXO modulating signal (Vmx). The VCXO 2 is said to have a limited "modulation bandwidth". The modulating frequency at which the frequency deviation of a VCXO 2 (or any VCO) is reduced to $\sqrt{2}/2$ (=0.707) of the frequency deviation at DC (with a fixed amplitude but variable frequency modulation applied) may be defined as the modulation bandwidth. For typical VCXO's the modulation bandwidth varies from about a hundred Hz to as high as about 10 KHz. Smaller crystals with larger effective "motional" inductance tend to be "stiffer" and not allow as high of a modulation bandwidth. For the high quality modulation of the two point VCO 40 and VCXO 2 modulated FM PLL the VCXO 2 modulation bandwidth would have to greatly exceed the loop bandwidth of the PLL. FIG. 13 shows a practical case of the output of this form of two point modulation where the loop bandwidth is again 354 Hz and the VCXO 2 modulation bandwidth is 1 KHz. The factor of four wider VCXO 2 bandwidth over loop natural frequency ($\omega_n$) does not provide sufficient margin, and the time domain modulation response is strongly distorted. This occurs because of the build up of phase error between the two inputs of the phase detector 14 during the time that the reference input is "catching up" to the VCO input. Only by severely restricting the loop bandwidth can the modulation quality be made acceptable. Since wider PLL bandwidth shortens lock time and suppresses the effects of mechanical vibration on noise (microphonic effect), extremely narrow loop bandwidths are generally undesirable.

U.S. Pat. No. 4,052,672, EXTENDED PHASE-RANGE, HIGH FIDELITY MODULATION ARRANGEMENT, issued to Enderby in 1977, presents a second way of performing two point frequency modulation of a PLL. The working concept is as follows. If a voltage opposite in sign but equal in magnitude to the modulation induced component at the phase detector output is summed into the phase detector output, the two components will cancel and the loop will be prevented from responding to the modulation. Because the VCO acts as an integrator from input voltage to output phase, the proper function is a scaled inverting integration of the modulating voltage. The system is shown in FIG. 14, with details of the correcting integrator circuit in FIG. 15. Referring now to FIG. 14 note the addition of "correcting integrator" block 58 that is also driven by modulation signal (Vm) 30 and that generates output (Ui) 64 that is equal in magnitude and opposite in sign to the modulation induced response in phase detector 14 output signal (Ud) 18. Signals (Ui) 64 and (Ud) 30 are summed to zero in loop filter summing node 68. The output signal (Uid) 74 of loop filter summing node 68 thus has zero response to the modulation. To prove this concept mathematically, we may solve for the frequency modulation transfer function $H_{fm}$ by the relations defined in FIG. 14. This yields:

$$H_{fm} = \frac{K_o\left(\frac{F(s)K_i}{s}+1\right)}{\frac{F(s)K_dK_o}{sN}+1} \qquad \text{Eq. (23)}$$

In Eq. (23) $K_i$ is the gain of the correcting integrator 58. We note that if:

$$K_i = \frac{K_oK_d}{N} \qquad \text{Eq. (24)}$$

then Eq. (23) reduces to $$H_{fm} = \frac{\omega_{out}}{V_m} = K_0, \qquad \text{Eq. (22)}$$

or the ideal FM PLL behavior. FIG. 16 shows the ideal modulation that results from this ideal situation, with similar loop parameters to the previous time domain circuit simulation figures.

Unfortunately, there are circuit errors and problems that degrade the necessary match condition Eq. (24). One primary source of error results from the fact that we cannot apply the ideal (or near ideal, as practice actually dictates due to non-ideal operational amplifiers) correcting integrator. Referring now to FIG. 15 there is shown the commonly known integrator circuit 121, based on operational amplifier 102. It is well known in the art that integrator circuit 121 has a significant limitation in that any DC voltage offset between input signal (Vin) 110 and operational amplifier non-inverting input 106 will result in (Vout) 116 integrating upward or downward without limit, or in practice until (Vout) 116 (or (Ui) 64 in FIG. 15) reaches the highest or lowest voltage that operational amplifier 102 can attain. Now referring again to FIG. 14, from the point that the integrator "hits the rail" the integrating action would be lost, and even before then the phase detector 14 or loop filter 22 would probably reach the limits of their own dynamic range. These limits may be avoided by periodically resetting the correcting integrator 58 and phase detector 14 as described by da Silva, though that method is undesirably complex for use in MicroRadio equipment. Size effective implementation would require costly custom integrated circuit development. An effective and simple means of preventing correcting integrator 58 saturation is to limit the DC gain as described in Enderby and shown in circuit form in FIG. 17. The resulting Bode plot is shown in FIG. 17A, and is of first order low pass form but typically with gain greater than 1. Here resistor 126 limits the DC gain by "bypassing" the integrator capacitor 114. The transfer function of the bypassed integrator is given by:

$$\frac{V_{out}}{V_{in}} = \qquad \text{Eq. (25a)}$$

$$\frac{-R_4}{R_3}\frac{1}{(sC_2R_4+1)} = \frac{-1}{sC_2R_3+\frac{R_3}{R_4}} = \frac{-K_i}{s+\frac{R_3K_i}{R_4}} = \frac{-K_i}{s+\frac{1}{R_4C_2}}$$

where $$K_i = \frac{1}{R_3C_2} \qquad \text{Eq. (25b)}$$

When the ideal correcting integrator 58 is replaced with the bypassed integrator circuit 124, distortion must result since the integrator no longer perfectly cancels the VCO and phase detector response to modulation. FIG. 18 shows the time domain response of the simulation case of 354 Hz loop bandwidth with 500 bits/sec modulation. The correcting integrator 58 is bypassed at 100 Hz, because it is found in practice that the bypassing cannot go much below that without significant noise distortion due to extra wide phase detector pulses that result from preventing loop response to modulation. The distortion of FIG. 18 is certainly much better than the one point uncompensated FM PLL under similar conditions (FIG. 8), but is still far from ideal. It may be shown that minimum distortion occurs for the bypassed integrator FM PLL if the modulation to the VCO 40 is single pole high pass coupled with the pole frequency equal to the pole frequency of the bypassed integrator circuit 124. This is shown in MSEE thesis "New Approach to Frequency Modulated Frequency Synthesis", F. Dacus, University of Texas at Arlington, May 1990, the disclosure of which is hereby incorporated by reference. This of course further emphasizes the high pass nature of the frequency modulation transfer function of the two point correcting integrator method with practical bypassed integrator.

Another problem that plagues both forms of two point modulation is the variation in VCO 40 gain ($K_o$) from unit to unit and over frequency. This variation causes mismatch away from the ideal conditions given in Eq. (19) for the modulated reference form and Eq. (24) for the correcting integrator form. The effects of mismatch for the correcting integrator case may be quantified by the definition of a new term, the integrator mismatch error ($\epsilon_i$), as shown below.

$$\varepsilon_i = K_i - \frac{K_o K_d}{N} \qquad \text{Eq. (26)}$$

Using (26) the signal to distortion ratio (SDR) for the two point correcting integrator FM PLL may be shown to be:

$$SDR(\text{corrected}) = \frac{K_o K_d}{N \varepsilon_i} SDR(\text{uncorrected}), \qquad \text{Eq. (27)}$$

where SDR(uncorrected) is the one point SDR given by Eq. (15). Note that as the integrator mismatch error ($\epsilon_i$) approaches zero, the signal to distortion ratio (SDR) approaches infinity for the ideal correcting integrator.

Another potential problem is for the correcting integrator method is for phase error to reach a magnitude where the phase detector 14 exceeds its usable range. Because the correcting integrator 58 prevents the loop from responding to the modulation induced phase error, the phase error at the phase detector input is:

$$\theta_e(t) = \int_0^t \frac{K_o V_m}{N} dt \qquad \text{Eq. (28)}$$

The system will maintain lock so long as the maximum phase error is kept within the limits of the phase detector 14, typically $+/-2\pi$. A useful special case of Eq. (28) that is handy for a quick check is that of a simple rectangular pulse of modulation. Then $$V_m t \le \frac{2\pi N}{K_o} \text{ must be maintained to stay in lock.} \qquad \text{Eq. (29)}$$

However, a problem likely to arise long before lock is lost is unacceptable carrier to sideband noise degradation. A major contributor to unwanted spectral components is the digital phase detector 14. The phase detector 14 represents the phase error in pulse width form, so there is undesired energy present at the divided reference (the phase detector sample rate) and its harmonics. Some of it gets through the filter to the VCO input voltage (Uv) 36, where it causes sidebands according to (from Dacus MSEE thesis):

$$SCR = \frac{V_t K_o}{2 f_m}, \text{ where} \qquad \text{Eq. (30)}$$

SCR=sideband to carrier ratio (a voltage magnitude ratio)
$V_t$=peak voltage at frequency $f_m$.

Modulation of the correcting integrator 58 FM PLL must generate wider 20 pulses on the phase detector output 16 that according to Eq. (30) will generate sideband spurs that are offset from the carrier at the phase detector sampling frequency and harmonics thereof. If the sampling rate at period $t_{ref}$ then the pulse width $\rho$ resulting from modulating signal $V_m$ is given by:

$$\rho(t) = \frac{t_{ref} K_o}{2\pi N} \int_0^t V_m(t) dt, \qquad \text{Eq. (31)}$$

assuming that $t \gg t_{ref}$ and the frequency of $V_m$ is much less than the sampling frequency of the phase detector 14. Determining a worst case for the integral under a specific modulation allows a quick calculation of the worst case sideband to carrier. Now to get the noise voltage from the phase detector pulses a Fourier analysis of the pulse train may be performed to yield:

$$Nth\_Harmonic\_Mag = 2|C_n| = \frac{2 V_{cc} \rho}{t_{ref}} Sa\left(\frac{\pi n \rho}{t_{ref}}\right), \text{ where} \qquad \text{Eq. (32)}$$

$C_n$=the complex Fourier series nth component coeffiecient
Sa(x)=sin(x)/x (the sampling function)
$V_{cc}$=the digital phase detector output pulse level.
Now, to get the noise voltage actually applied to the VCO 40 the voltage from Eq. (32) is multiplied by the loop filter suppression at the frequency of the term in question, and the result used as $V_t$ in Eq. (30). This procedure is accurate for the first few harmonics, and sets a worst case for higher ones. Given the spectral purity expected of modem transmitters, it would be common for the resulting sideband levels to be unacceptable in the two point correcting integrator case.

One point direct VCO modulation was shown above to possess extreme distortion that renders it useless if there is significant low frequency content in the modulation used. Both forms of two point modulation that exist in the prior art can provide an approximate order of magnitude increase in typical signal to distortion ratio, but often this result is still unacceptable in terms of final signal to distortion ratio. However, as was shown in analysis above, the two point forms have offsetting strengths and weaknesses. The modulated reference form has the benefit of true DC modulation and very low sideband response, but the weakness of very low loop bandwidth. The correcting integrator form has the strength of allowable wide loop bandwidth, but the weaknesses of not allowing DC modulation and undesirable sideband response. The present invention eliminates these weaknesses while maintaining the strengths, via a non-obvious combination of these two methods. This combination is difficult to visualize because the resulting "double correction" would lead to severe distortion. This is almost certainly the reason that this concept has not been previously conceived in the long prior art history of the modulated phased locked loop. However, it will be shown herein that there is an invention that allows the ideal blending of these methods, achieving the desired elimination of the weaknesses of each while maintaining the strengths, and doing so within the limitations of practical circuitry.

FIG. 19 shows the three point modulation block diagram that will be used to prove this in the following analysis. FIG. 19 shows modulating signal (Vm) 30 being applied to the VCO 40, VCXO 2 and correcting integrator 58 to provide three point modulation via the VCO (or other ECO), modulated VCXO (or other ECRS) reference, and bypassed correcting integrator. Although modulating signal (Vm) 30 is shown the same for all three points where it is applied, in practice circuit design details typically lead to it being scaled differently. To compensate for this, VCO scaling function ($A_v(s)$) 96, integrator scaling function ($A_i(s)$) 90, and VCXO scaling function ($A_x(s)$) 98 are included. The key breakthrough is to conceive of a way of blending the corrections applied by the modulated reference and the correcting integrator to avoid double correction and resulting severe distortion. The "blending functions" $B_x(s)$ 80 for the modulated reference and $B_i(s)$ 88 for the correcting integrator are crucial to combining these corrections in such a way that ideal modulation is attained. We begin the proof with derivation of the frequency modulation transfer function for FIG. 19, which yields:

$$H_{fm}(s) = \frac{K_o A_v \left( s + \frac{F K_i B_i A_i}{A_v} + \frac{F K_d K_{ox} B_x A_x}{M A_v} \right)}{s + \frac{K_o F K_d}{N}} \quad \text{Eq. (33)}$$

In Eq. (33), F, $B_i$, and $B_x$ are functions of s, and $K_{ox}$ may also be considered a function of s in order to model the VCXO modulation as function of frequency. The desired modulation is:

$$H_{fm} = \frac{\omega_{out}}{V_m} = K_o A_v, \quad \text{Eq. (34)}$$

which is same as Eq. (22) except that VCO scaling function ($A_v$) is included. Referring to Eq. (33), the desired ideal modulation of Eq. (34) will be supplied if:

$$K_i B_i A_i + \frac{K_d K_{ox} B_x A_x}{M} = \frac{K_o K_d A_v}{N} \quad \text{Eq. (35)}$$

The three point modulation matching condition expressed in Eq. (35) is a general relationship of which both forms of two point modulation are special cases. For example, the ideal correcting integrator 58 special case, in which $K_{ox}$ is zero and $B_i$ is 1.0, reduces Eq. (35) to:

$$K_i A_i = \frac{K_o K_d A_v}{N}, \quad \text{Eq. (36)}$$

which is equivalent to Eq. (24) extended for the presence of integrator scaling function ($A_i$) 90 and VCO scaling function ($A_v$) 96. Also, the special case of the two point modulated reference, where the correcting integrator 58 gain ($K_i$) is zero and the VCXO blending function ($B_x$) is 1.0, reduces Eq. (35) to:

$$\frac{K_{ox} A_x}{M} = \frac{K_o A_v}{N}, \quad \text{Eq. (37)}$$

which is the extension of the simpler Eq. (19).

The special case conditions of Eqs. (36) and (37) still hold as approximately true under three point modulation conditions (meaning an appropriate frequency range of modulation) where each form of correction (modulated VCXO 2 or modulated correcting integrator 58) is the dominant form. In general, the modulated VCXO 2 provides the majority of the correction at low frequencies, and the modulated correcting integrator 58 the majority of correction at higher frequencies. In the zones of frequency where each dominates and the contribution of the other is approaching zero, the corrections they each apply in their respective zone must be approximately equal. From this realization a "loop frequency modulation magnitude matching function" Lfm is defined as:

$$L_{fm} = K_i A_i = \frac{K_o K_d A_v}{N} = \frac{K_{ox} K_d A_x}{M} \quad \text{Eq. (38)}$$

Eq. (38) defines the proper "magnitude matching" needed for correct modulation. For the sake of convenience, we shall in the claims refer to Eq. (38) as simply the magnitude matching function, though it is clear that there are actually several equality relationships (and thus functions) described by this equation. Substituting Eq. (38) into Eq. (35) results in a common factor of Lfm in each term, yielding the critical result:

$$B_i(s) + B_x(s) = 1 \quad \text{Eq. (39)}$$

to achieve the ideal modulation function of Eq. (34).

In the presence of proper magnitude matching as given in Eq. (38), Eq. (39) defines the proper "frequency blending function" needed for correct modulation. For the sake of convenience, we will sometimes refer to Eq. (39) as simply the "frequency blending function", though there is a frequency blending function $B_i(s)$ for the integrator, and a frequency blending function $B_x(s)$ for the VCXO that are functionally related. As Eq. (39) shows, they are functions of frequency and are also dependent on each other. When Eq. (38) and Eq. (39) are exactly satisfied, then perfect modulation will result.

Since the VCXO 2 has a natural low pass response, the only logical assignment of a function for the VCXO blending function ($B_x(s)$) 80 is a low pass filter. This may be the VCXO's 2 naturally occurring low pass filter shape, or for more accuracy a more controllable externally applied filter. Assume that the VCXO blending function ($B_x(s)$) 80 is a single pole low pass of form:

$$B_x(s) = \frac{\omega_p}{s + \omega_p} \quad \text{Eq. (40)}$$

Substituting Eq. (40) into Eq. (39) and solving for $B_i(s)$ gives:

$$B_i(s) = \frac{s}{s + \omega_p} \quad \text{Eq. (41)}$$

Eq. (41) is a simple first order high pass function with the exact same corner frequency as the low pass function of Eq. (40). Equations (40) and (41) give the most common special cases of first order blending functions for Eq. (39). Though not perfect modeling, in practice it is found that first order blending does result in fairly high quality modulation.

Note that if this $B_i(s)$ high pass is cascaded with an integrator with transfer function $$I(s) = \frac{K_i}{s} \quad \text{Eq. (42)}$$

then the resulting transfer function is:

$$I(s) B_i(s) = \frac{K_i}{s} \frac{s}{s + \omega_p} = \frac{K_i}{s + \omega_p} \quad \text{Eq. (43)}$$

Compare the high passed integrator of Eq. (43) with the inverting bypassed integrator transfer function of Eq. (25a), repeated below.

$$\frac{Vout}{Vin} = \frac{-R_4}{R_3} \frac{1}{(sC_2R_4+1)} = \frac{-1}{sC_2R_3 + \frac{R_3}{R_4}} = \frac{-K_i}{s + \frac{R_3K_i}{R_4}} \quad \text{Eq. (25a)}$$

$$= \frac{-K_i}{s + \frac{1}{R_4C_2}}$$

Discounting the negative sign, which may be accounted for in circuit design, we see that if $$\omega_p = \frac{1}{R_4C_2}, \quad \text{Eq. (44)}$$

then the high pass filter plus integrator cascade is equivalent to the bypassed integrator. Thus the first order correcting integrator blending function Bi(s) 88 may be developed by bypassing the correcting integrator 58. The bypassed integrator circuit and Bode plot are illustrated in FIGS. 17 and 17A.

Note also that the blended integrator function of Eq. (43) and the equivalent bypassed integrator have yet another equivalent form, that of a simple RC low pass filter. The Bode plot 130 in FIG. 17A for the bypassed integrator has the exact same functional shape as a simple first order RC low pass filter made with one resistor and one capacitor. The operational amplifier based or "active" bypassed integrator does have the advantages of providing a low impedance drive and an adjustable gain that may be above or below unity. The simple RC filter has DC gain of 1.0, so if it is used as a substitute for an active bypassed correcting integrator proper scaling must be provided elsewhere. The RC filter form of bypassed correcting integrator also is noninverting, which of course must also lead to an inversion elsewhere as compared to an inverting active bypassed correcting integrator. However, there are cases where circuit efficiency can be enhanced by use of an RC filter as a bypassed correcting integrator in either the two point or three point forms. Thus the use of the term "bypassed correcting integrator" shall be understood herein to include the simple RC first order low pass filter.

In summary, the present invention of three point frequency modulation of a PLL uses the VCXO 2 (or other reference source) modulation to provide DC modulation and to prevent loop response to low frequency components of the modulation, the bypassed correcting integrator 58 to prevent loop response at higher frequencies, and proper blending of these functions in the medium frequency range. Eq. (38) gives the "magnitude matching conditions" that are needed, and Eq. (39) governs the blending over frequency that is needed once the magnitude matching is correct. Equations (40) and (41) give the special case for Eq. (39) where simple single order filtering functions are used for blending. Referring to FIG. 19 from which these equations are derived, note that with respect to low frequency VCXO 2 and VCO 40 modulation Eq. (38) conveys the fundamental design information that the VCXO 2 frequency divided by M must be modulated the exact same amount as the VCO 40 frequency divided by N, just as it must be for the two point modulated reference case. According to Eq. (38), the modulation applied to the positive input 10 and negative input 12 of the phase detector 14 must be equal for the phase detector 14 to provide zero output and thus no loop response. Eq. (38) also shows that the high frequency path of the correcting integrator gain ($K_i$) must match the VCO 40 through phase detector 14 path in amplitude but be opposite in sign, so that when those two paths are summed on the phase detector summing node 68 they cancel. In medium frequencies, both compensate the loop when they are each partially blended in via the VCXO blending function ($B_x(s)$) 80 and correcting integrator blending function ($B_i(s)$) 88. The simplest case of useful blending functions are simple first order low pass and high pass functions, where the corner frequencies are simply set to the same frequency for proper blending to occur. These are not only easily realizable, they agree perfectly with the first order actual circuit character of practical VCXO 2 and correcting integrator 58 design, resulting in an elegantly efficient and natural implementation.

The invention and analysis shown are also independent of the form of electronically controlled oscillator and reference source, and current controlled or other electronically controlled sources may be substituted. The analysis shown may be repeated with simple changes in variable names and units to yield the same basic results. For example, a "Direct Digital Synthesizer" (DDS) can conveniently be substituted for the more common VCXO reference. A DDS is usually implemented with a digitally controlled Digital to Analog Converter (DAC) to "build" a reference waveform. Such sources eliminate the limited tune range and linearity difficulties of VCXO and other high Q oscillator reference sources. DDS sources are also referred to as "Numerically Controlled Oscillators", or NCO's, despite the fact that they are not truly "oscillators" DDS sources can also provide a convenient "fine tune" function that allows the present invention to generate any carrier frequency in between the stepping frequencies normally associated with a crystal reference. By combining a lower frequency DDS with a higher frequency source and appropriate mixing and filtering, a cost effective and low power higher frequency source can be generated that allows precise digital frequency control over a range suitable for a large set of PLL reference source applications.

FIG. 20 depicts the ideal modulation that results when the circuit is set up according to Eqs. (38), (39), (40), and (41) for correct amplitude matching and blending. In the SPICE simulation that generated this figure, the loop bandwidth is 354 Hz, and the corner frequencies of $B_x(s)$ and $B_i(s)$ are at 100 Hz, with the modulation at 500 bits/sec. Unlike previous forms of direct PLL modulation, this ideal modulation is achieved with practical, compact, and low power subsystems.

In practice component variations limit the ability to maintain the required match conditions without trimming over unit to unit, frequency, and temperature variation. The VCO 40 and VCXO 2 not only show significant unit to unit variation, but are nonlinear with respect to their tune voltages. A typical VCO tune curve was shown in FIG. 2, and a typical VCXO tune curve is shown in FIG. 21. When the VCXO used as a modulated reference for either two point or three point modulation, the typical modulation range is shown at V1 to V3. The voltage range below V1 and above V3 allows margin for temperature compensation and unit to unit calibration. To maintain high performance in the three point modulation method, both the VCO and VCXO tune curves must be calibrated for unit to unit and temperature variation and "linearized" to maintain acceptable matching accuracy.

The term linearization is used here to mean the use of an analog or digital function that cancels the nonlinearity in question via the application of another nonlinearity or an adaptable gain or attenuation. For the concave down tune slope of the VCO 40 as shown in FIG. 2, an appropriate large signal linearization function would be a concave up voltage to voltage transfer function that would be cascaded with the VCO input voltage (Uv) 36 to provide a composite voltage to frequency transfer function that appears linear. The cascade may be said to have a linear "effective gain". Such linearization is conceptually depicted in FIG. 22. The original nonlinear function F1 is transformed by multiplication with linearizing function F2 to provide linear effective gain function F3. Other operational forms are possible, and in case of digital or software based linearization many variations are possible. An analog implementation of this linearization is shown in FIG. 23, where the nonlinear voltage-current characteristic of semiconductor diodes is used to generate a nonlinearity of the approximately required shape. The resulting voltage to voltage transfer function is shown in FIG. 23A. Note that the continuously nonlinear linearization process as depicted in FIGS. 22 and 23A provides complete linearization—the process applies to both small and large signal quantities. Small signal linearization, where the linearization is only highly accurate around an "operating point", can also be effective and is contemplated by the present invention. In particular, small signal linearization is typically quite effective for the VCO, since the modulation is usually small with respect to the total frequency range the VCO can tune over. However, small signal linearization is less effective for the VCXO reference, since the modulation applied typically covers a large fraction of the nonlinear tune range of the VCXO. Only in the case of fairly wide tuning VCXO's and with some tolerance of distortion is small signal linearization typically acceptable for VCXO's.

Digital linearization, calibration, and temperature compensation is more convenient and has the potential to be more accurate, so long as the discontinuous or sampling nature that results is acceptable. These three fundamental compensations shall collectively be referred to here under the term "digital compensating function", and any of these in either analog or digital form shall be referred to using the general terms "compensation", "compensation function", or "compensating function". Modern highly compact microcontrollers, analog to digital converters (ADC's), digital to analog converters (DAC's), and digital memories are normally present in the types of systems that could make potential use of the three point modulation system described above, and provide the necessary means to perform efficient and accurate digital compensating functions. In addition to accurate calibration over unit to unit variation, frequency, and temperature, the digital compensating function has the advantage that it may be implemented in automated, software controlled test systems. Accordingly, a digital compensating function may be conveniently applied to the three point modulation system.

When we say that the VCO tune curve may normally be considered "small signal linear" with respect to modulation, the mathematical meaning is that over the typical frequency deviation desired the tune slope of the curve ($K_o$) may be considered constant. In other words, the variation in the derivative of the VCO tune slope with respect to tune voltage may be neglected over the frequency deviation of the applied modulation. Thus linearization of the VCO to maintain the desired match conditions becomes a function of the carrier frequency (and particular unit and temperature), not requiring linearization over the applied modulation range while the modulation is in progress. This allows a simplified form of linearization to be provided with a digitally controlled variable gain but still linear amplifier in series with the VCO 40. This digitally controlled amplifier form differs from the analog nonlinear amplifier of FIG. 23 in that it is truly a linear amplifier at each gain setting, merely one whose gain is a function of digital control. The gain of this amplifier becomes a function of the frequency at which the synthesizer is locked, such that at frequencies where the VCO tune slope or gain (Ko) is lower, the digital amplifier gain is set higher, so that the product of the gain of the digital amplifier and the small signal gain (derivative of frequency with respect to VCO input voltage) of the VCO 40 remains constant or near constant as required to satisfy Eq. (38).

FIG. 24 presents an enhanced digitally calibrated and linearized form of the three point frequency modulated PLL. VCO 40 linearization and gain control are provided digitally with the variable gain amplifier composed of digital potentiometer 216, operational amplifier 220 and resistors 214 and 224. An example of a suitable digital potentiometer is the Dallas Semiconductor DS1803, which allows serial control with an 8 bit setting that provides 256 different potentiometer values. This is sufficiently fine Granularity to provide excellent linearization over a broad range of variation in tune slope. This linearizing amplifier is of standard inverting amplifier form, thus allowing a convenient summing operation for injection of modulation. Modulation is applied through resistor 214 and PLL tuning voltage is applied through resistor 224. Digital potentiometer 216 is set under control of microcontroller 204 to a value appropriate for the channel in use, left at this setting during modulation, and changed as needed when frequency changes are made to new channels. A new setting may be read from memory or calculated when the synthesizer is set to a new frequency. Due to the slowly changing shape of the VCO tune curve, memory may be saved by storing a limited number of potentiometer settings corresponding to frequencies across the band, and linear or nonlinear interpolation used to calculate the potentiometer setting for frequencies in between.

Because the change in gain as applied in the above method alters the effective VCO gain (the cascade of VCO gain (Ko) and the linearizing amplifier gain) with respect to both modulation and PLL frequency control, this method may be referred to as the "dual digital VCO compensating and linearizing method". Under this method a single digital control setting may usually apply good approximate linearization for a significant set of contiguous channels, due to the fact that the VCO tune slope does not change much over a restricted frequency range. Thus for frequency changes to nearby channels the system provides improved control of PLL parameters such as natural frequency and damping factor. For frequency hopping spread spectrum systems this allows minimization of the hopping time. For example, under the FCC 15.247 ISM band rules for frequency hopping spread spectrum systems using channel bandwidths less than 250 KHz in the 902 to 928 MHz band, at least 50 channels must be used. For a channel spacing of 50 KHz, there are actually 518 useful channels at this spacing, allowing 10 of the 50 channel sets. Each 50 channel set takes 2.5 MHz if they are contiguously assigned. Due to limited VCO tune slope variation over this restricted band, if the channel hops among 50 such channels are performed with the digital pot setting for the center channel, the previous channel, or the next channel, the loop parameters will be well controlled and frequency settling time can be minimized. Minimum settling time is usually attained with digital control set for the next hopping channel and with the design such that the damping factor $\zeta=0.707$.

FIG. 24 also shows provision for a processor controlled loop bandwidth control. This is highly useful for minimizing transmit-receive turn around time in transceive systems, and for minimizing hopping time in frequency hopping spread spectrum systems. Operation may be understood as follows. Recall from the initial PLL description that:

$$\omega_n = \sqrt{\frac{K_0 K_d}{\tau_1 N}} \qquad \text{Eq. (8a)}$$

(loop natural frequency, 0.707 of loop bandwidth)

$$\zeta = \frac{\tau_2 \omega_n}{2} \qquad \text{Eq. (8b)}$$

(damping factor, set to 0.707 for minimum settling time)
In these equations the loop filter parameters $\tau_1$ and $\tau_2$ are given by:

$$\tau_1 = R_1 C_1 \qquad \text{Eq. (2)}$$

and $$\tau_2 = R_2 C_1 \qquad \text{Eq. (3)}$$

and the loop filter transfer function (F(s)) is given by:

$$F(s) = \frac{-(1 + s\tau_2)}{s\tau_1} \qquad \text{Eq. (1)}$$

To minimize lock time the largest possible loop bandwidth must be used, but this will usually be in conflict with the general noise and distortion requirements of modulation. Both goals may be satisfied by temporarily increasing loop bandwidth during the channel changing operation, and then switching back to a lower loop bandwidth during modulation. By inspection of Eq. (8a) it is clear that if $\tau_1$ is decreased the loop bandwidth will increase, and from Eq. (2) this increase can be accomplished by decreasing R1, which is resistor 234 in FIG. 24. This is accomplished by switching resistor 235 into parallel with 234 via electronic analog switch 237 which is closed by control signal FastLock 229. However, from Eq. (8b) it is noted that this increase in loop bandwidth would also increase damping factor ($\zeta$), which would normally be undesirable. For stability purposes $\zeta$ should be maintained greater than 0.5, and for minimum settling $\zeta$ should be maintained at 0.707. Assuming $\zeta$=0.707 in the normal bandwidth case, this may be accomplished by decreasing $\tau_2$ to compensate the increase in $\zeta$ with loop bandwidth. This requires making R2 smaller, which is resistance 226 in FIG. 25. This is accomplished with a second analog switch 231, also closed by FastLock 229, that brings resistor 227 into parallel with 226 and effectively reduces its resistance. This method is highly effective, but note from the square root function in Eq. (8a) that there are practical limits to the range of bandwidth available. A factor of 10 change in resistance only generates a factor of 3.16 change in loop bandwidth. Further examination of Eq. (8a) also shows that a further extension in bandwidth increase may also be obtained by processor controlled temporary reprogramming of VCO divider "N" to a smaller number. This is equivalent to a temporary increase in channel step size, so also requires temporary reprogramming of reference divider "M". If this opportunity is taken advantage of then it must be recognized that not all normal channels can be exactly "fast locked". The reprogramming of the dividers provides a fast lock mode that will get to the vicinity of the final channel, at which time the dividers are reprogrammed to their normal values and some additional time is needed to settle exactly on channel. Before modulation commences signal FastLock 229 is returned low and the PLL reassumes its normal operating bandwidth. The combination of these techniques with the linearized VCO allows precision control of loop parameters and minimum settling time during synthesizer locks.

In another design, the effective VCO modulation is linearized by adapting the applied modulation voltage magnitude as a function of the channel in use so that the applied modulation times the VCO tune slope Ko in the operating channel is an approximate constant leading to near constant deviation over carrier frequency, meaning it obeys the magnitude matching conditions of Eq. (38). This essentially is varying the VCO scaling function (Av) in Eq. (38). This effect may be generated by a variety of methods, including nonlinear analog amplifiers or attenuators, digitally controlled linear amplifiers as presented above except that such amplifiers are in the modulation path only and not in the control loop also, and digital to analog converter applied modulation whose amplitude is under processor control and can thus be a function of channel. This will allow meeting the magnitude matching conditions, but has the disadvantage of not simultaneously providing linearization with respect to phase lock loop parameters, unlike the dual digital VCO linearizing method discussed above.

As shown in FIG. 21, the restricted tuning range of the VCXO 2 may render it significantly nonlinear over the applied modulation. In fact it is almost always the limited tune range of the VCXO 2 that sets limits on the frequency deviation and thus data rate that may be transmitted. Getting a good match over the full possible range of VCXO 2 modulation is needed to assure low distortion with significant frequency deviation. Depending on the frequency deviation and the particular VCXO design, maintaining close match conditions may require linearization as a function of the instantaneous modulation. If the required frequency deviation of the VCXO allows small signal operation then a variable gain amplifier system as described above for the VCO may be applied. If, however, the required frequency deviation covers a large enough segment of the VCXO tune curve to encounter significant nonlinearity then a more extensive large signal linearization process will be required for the VCXO 2. This large signal linearization process requires that the tune voltage of the VCXO 2, signal FiltXtalTune 252 of FIG. 24, be adapted (linearized) to give a desired change in frequency that is proportional to modulating signal ModInput 200. This large signal linearization process can only be perfectly preformed by an ideal analog linearizer, which is difficult to match on a case by case basis. However, because of the limited bandwidth of the VCXO 2, which has been deliberately low pass filtered in accordance with the required match conditions of three point modulation, it is quite practical to have the VCXO frequency control FiltXtalTune 252 be provided with a DAC output XtalTune 250. Modemn DACs have sufficiently fast settling time and update rates that even low power DACs can update rapidly enough to simulate continuous frequency control with respect to the limited VCXO 2 bandwidth. Even fairly low speed microcontrollers 204 arc able to keep up with a linearization algorithm that uses stored linearizing parameters that are unit to unit and temperature variable. Thus digital compensation may be applied despite its discontinuous nature in this large signal linearization case.

One effective way to perform this large signal VCXO linearizing is to store a small set of DAC 248 codes, typically in the range of three to thirty, with the larger amounts chosen for situations of greater VCXO 2 nonlinearity, where each DAC 248 code corresponds to equally spaced intervals of frequency. The processor in the microcontroller 204 can interpolate to select codes in between these codes as needed, and usually linear interpolation will be sufficient. For example, if a three point modulation system design had a 20 MHz VCXO, then to modulate a 915 MHz carrier by a peak to peak frequency deviation of 91.5 KHz the VCXO 2 must modulate a total of 2 KHz peak to peak. This is the exact same percentage of deviation for the VCXO 2 at 20 MHz as the 91.5 KHz is of the VCO 40 at 915 MHz. If an 11 DAC 248 code VCXO 2 modulation table is stored, then the DAC 248 codes are selected during manufacturing calibration to correspond to VCXO 2 frequency steps of 200 Hz. Given the 11 DAC 248 code table with 10 segments of 200 Hz each, let the table entries be numbered from 0 to 10, so DAC 248 code 5 is the code that corresponds to 20 MHz exactly except for unavoidable small quantization error. Referring now to FIG. 24, during modulation, at each DAC 248 update time the processor 204 firmware reads the low pass filtered (by VXCO blending function (Bx(s)) 280) applied modulation via ADC 272. This gives a reading that is constrained by design to be between two endpoints of voltage, for example 0 to 3 volts. Let a particular reading be 2.16 volts, which is 72% of the way from 0 to 3. Thus the applied VCXO 2 frequency should be 72% of the way up from the lowest frequency of the VCXO 2 modulation range, which is 1.44 KHz from the low end, or 440 Hz above the center frequency of exactly 20 MHz. Given the table definition described this frequency will fall between DAC 248 codes 7 and 8, and a very close approximation to a DAC 248 voltage that gives this exact frequency (except for small quantization error) can be found by a simple linear interpolation between DAC 248 codes 7 and 8. The processor 204 runs this interpolation algorithm and updates the DAC 248 to the calculated code. It is found by simulation and in practice that low distortion will be obtained with DAC 248 update rates that are bout 20 or more times greater than PLL loop bandwidth. For typical loop bandwidths of 100 Hz to 1 KHz, this is 2000 to 20,000 DAC 248 updates per second, which is well within the performance allowed by modern low power circuitry.

This VCXO 2 linearizing process may be extended to allow for the exact magnitude matching to be maintained over a wide range of VCO 40 frequency while maintaining constant frequency deviation over the carrier frequency band by inputting the VCXO 2 modulation table for the lowest VCO 40 frequency to be used. For a constant frequency deviation of the RF carrier this corresponds to the widest frequency deviation as a percentage of the carrier, which is the widest percentage the VCXO 2 will have to be modulated. The firmware may then calculate a new table for any particular higher VCO 40 frequency used, one that is contained within the endpoints of the single stored table. This temporary table is then used for modulation on the higher frequency channel.

The VCXO 2 linearizing process, either large or small signal form, may be temperature compensated by providing a set of tables over the temperature range to be used, for example −30 to +85 degrees centigrade. Over this range, depending on the VCXO 40 temperature drift character and desired frequency accuracy, 3 to 15 such tables might be stored. The system employing the three point modulation may be made temperature aware with the use of modern integrated electronic thermometers. An example of such a thermometer is the Dallas Semiconductor DS1624, which provides temperature as a digital word that is conveniently read by a processor 204. The system firmware uses this temperature awareness to interpolate and set up a temporary table for the present temperature, preferably one corresponding to the lowest VCO 40 frequency, so that another temporary table may be calculated for the actual carrier frequency in use. This final temporary table derived from the above two described interpolations in interpolated itself for filtered modulation duty cycle at each DAC 248 update during modulation. Similarly the VCO 40 gain table of digital linearization control values may also be made a function of temperature as well as frequency, and interpolated as necessary between the table points.

The firmware controlled digital compensation process for the VCXO 2 is assumed in FIG. 24, where at least a single pole low pass response of the VCXO 2 is set by resistor 276 and capacitor 278. Assuming the natural low pass modulation bandwidth of the VCXO 2 is much higher than the pole of B(x) resistor 276 and B(x) capacitor 278, then the RC product of B(x) resistor 276 and B(x) capacitor 278 are set equal to the RC product of correcting integrator capacitor 266 and correcting integrator bypassing resistor 264. This is in accordance with matching condition of equations (38), (39), (40), and (41), where the low pass corner of the VCXO 2 is set equal to the high pass corner of the correcting integrator 58.

In practice the VCXO 2 has an inherent internal low pass character that in a particular case may noticeably impact the shape of any external low pass 10 filtering of the VCXO 2 tuning. Any DAC smoothing filtering 280 applied also adds to the total VCXO 2 filtering. In that case the first order low pass pole formed by Bx(s) resistor 276 and Bx(s) capacitor 278 may be set slightly higher in frequency than the ideal match condition as partial compensation. In practice this is found to yield excellent results if the main Bx(s) pole is kept a decade or more below the natural first pole of VCXO 2 and any DAC 248 smoothing, but if in a particular case better performance is needed then the correcting integrator blending function Bi(s) 88 may be adapted so that Eq. (39) still holds true with the total VCXO blending Function Bx(s) 80 in use. Here the term "total Bx(s) in use" means the total filtering as seen between the modulating signal ModInput 200 and the VCXO frequency output 4, and so takes into account the intended single order low pass filter function for VCXO blending function (Bx(s)) 80, any DAC smoothing 280, and the frequency response of the VCXO 2 itself. Defining the term Bxt(s) for the total Bx(s) in use, Eq. (39) may be extended as:

$$B_i(s) + B_{xt}(s) = 1 \qquad \text{Eq. (39a)}$$

For purposes of the present invention, reference to meeting the blending function requirements of Eq. (39) is also intended to mean meeting Eq. (39a) to a sufficient level of approximation to meet the signal to distortion ratio (SDR) requirements of a particular implementation. In practice, for moderate loop bandwidths the first order low pass approximation of the total frequency response Bxt(s) discussed above provides acceptable performance. For higher loop bandwidths, such as needed for frequency hopping spread spectrum systems or for higher suppression of microphonic effects, the modulation bandwidth of the VCXO 2 may need to be pushed out towards the physical limit of what the VCXO 2 can provide. In most of these cases a second order two pole approximation for the total modulation function Bxt(s) of the VCXO 2 reference is sufficient. The matching function for correcting integrator blending function Bi(s) 88 of Eq. (39a) may be found for the second order case as below.

First, let Bxt(s) be given by:

$$B_{xt}(s) = \left(\frac{\omega_{p1}}{s+\omega_{p1}}\right)\left(\frac{\omega_{p2}}{s+\omega_{p2}}\right) \quad \text{Eq. (45)}$$

In Eq. (45), one pole will normally of lower frequency and may be referred to as the "dominant pole". This dominant pole will normally be implemented external to the VCXO 2 so that it may be accurately controlled, but it could be the natural roll off of the VCXO 2 itself. Substituting Eq. (45) into (39a) and solving for Bi(s) yields:

$$Bi(s) = \left(\frac{s}{s+\omega_{p1}}\right)\left(1+\frac{\omega_{p2}}{s+\omega_{p2}}\right) = F_1(s)F_2(s), \text{ where} \quad \text{Eq. (46)}$$

$$F_1(s) = \frac{s}{s+\omega_{p1}} \quad \text{Eq. (46a)}$$

(first order highpass, usually implemented by bypassing the correcting integrator), and $$F_2(s) = 1 + \frac{\omega_{p2}}{s+\omega_{p2}} \quad \text{Eq. (46b)}$$

(one plus a standard first order lowpass)

Eq. (46) indicates that when VCXO blending function Bxt(s) changes from a first to second order low pass, the correcting integrator blending function Bi(s) changes from a single order high pass to a cascade of a single order high pass and a new function that is one plus a low pass. The new low pass addition provides an extra amount of compensation through the correcting integrator to account for the fact that the VCXO 2 is rolling off with an additional low pass pole $\omega_{p2}$ and is thus not contributing the compensation expected.

The function shown in Eq. (46) may be conveniently implemented with the circuitry shown as low pass plus one $F_2(s)$ block 284 and high pass $F_1(s)$ block 267 in FIG. 24. The function $F_2(s)$ of low pass plus one block 284 may be formed by simply adding first and second low pass resistors 285 and 286 and low pass capacitor 287 to a buffer based on low pass operational amplifier 288 that already tends to be present in a practical circuit. The high pass function $F_1(s)$ of high pass block 267 is implemented as the necessary integrator bypass formed with high pass resistor 264 working with correcting integrator capacitor 266. Circuit analysis shows that:

$$\omega_{p1} = \frac{1}{R_{264}C_{266}}, \text{ for the } \omega_{p1} \text{ of eq. (46a), and} \quad \text{Eq. (46a1)}$$

$$\omega_{p2} = \frac{1}{R_{286}C_{287}}, \text{ for the } \omega_{p2} \text{ of eq. (46b).} \quad \text{Eq. (46b1)}$$

The form of low pass filtering for the VCXO 2 shown in FIG. 24, where the most dominant low pass pole is formed by B(x) resistor 276 and B(x) capacitor 278, is technically the most correct, in that the dominant filtering occurs before linearizing. Here filtering is applied to the modulation, the result is digitized by ADC 272 in order to place the filtered modulation in digital form, and the processor 204 may then apply linearization before applying the tuning to the VCXO 2 through DAC 248. It is also possible, at the cost of some increase in distortion, to attain greater circuit simplicity by applying the dominant lowpass filtering after linearizing, such as on a low pass filter on the input to the VCXO 2. An example would be low pass filtering implemented as DAC smoothing block 280 in FIG. 25, where the functions of DAC smoothing and Bx(s) dominant low pass filtering may be combined.

Implementation of the dominant pole of $B_{xth}(s)$ by Digital Signal Filtering (DSP) can also be useful. This is particularly convenient in the case of digital modulation controlled by microcontroller 204. When the modulating signal is described in a series of digital words operated on by microcontroller 204, this modulating signal is referred to as being in the "digital domain" or in "digitized form". With the firmware already aware of the content of the digitized form "word stream" that is inherent in driving a digital to analog converter, it may conveniently apply a simple filtering algorithm to the digital word stream data in order to directly drive the VCXO 2 tune DAC 248, thus allowing elimination of ADC 272 and the low pass filter formed by Bx(s) resistor 276 and Bx(s) capacitor 278 This digital filtering also allows convenient implementation of more complex or better controlled forms of Bxt(s), such as compensating the VCXO 2 itself for non-ideal effects more accurately than the assignment of a first or second order linear low pass filter model allow. Many other circuit imperfections, including component variations that cause variation in the correcting integrator gain (Ki) and the corner frequencies of correcting integrator blending function (Bi(s)) 88, may be compensated for by adapting the coefficients of a digital filter for Bxt(s). Another ideal use for digital filtering would be when the reference source is the aforementioned Direct Digital Synthesizer (DDS). In this case the reference modulation is inherently within the digital domain, so the required low pass filtering may conveniently be performed using DSP. The techniques of DSP further extends the digital compensation of the disclosed three point modulation system. It must be noted that the introduction of DSP requires that the definition of the term "signal" be extended from analog variables such as voltage and current to also include numerical "signals" that are described as numbers or digital variable values that are functions of time.

The ideal fulfillment of the required matching conditions requires that any filtering of the modulation, such as that which is applied when shaping digital symbols for minimum spectral "splatter", be included in all three paths of the modulation. However, in practice the dominant low pass corner frequency of the VCXO blending function Bxt(s) is usually several orders of magnitude below the modulation comer frequency of digital symbol shaping filtering. Thus the effect of such filtering is usually negligible when modulating the VCXO 2, and may in practice usually be left out. This is convenient in circuit design because the relative gain of the VCO 40 is usually many orders of magnitude greater than that of the VCXO 2, so including the identical filtering would often lead to extra filter or gain stages placed to overcome the large difference in the voltage magnitude of the modulation as applied to the VCO 40 and VCXO 2.

Another potential problem may be introduced in practice when the correcting integrator output CorrIntOut 212 is AC coupled into the summing node of the loop filter based on correcting integrator operational amplifier 230. This prevents unavoidable small DC voltage errors in CorIntOut 212 from having to be compensated by phase detector pulse width that can increase spurious sidebands. In that case correcting integrator blending function (Bi(s)) 88 has technically been altered and Bxt(s) may need to adapt from the ideal first or second order low pass case so that Eq. (39a) still holds. It is normally found in practice that acceptable performance is attained with first or second order functions for Bx(s) and Bi(s) by setting the high pass pole of resistor 232 and a series capacitor (not shown) to be a frequency at least a decade below the dominant pole of Bx(s).

In the case of digital frequency shift keyed modulation (FSK), high data rates require proportionally larger FM deviation for proper modulation. In general it is well known in the communications art that peak to peak frequency deviation in Hertz of a frequency modulated carrier should be at least half of the data rate in bits per second. Thus higher data rates require larger carrier frequency deviation which in turn requires a larger proportional modulation of the reference frequency in order to maintain the magnitude matching conditions of Eq. (38). It is inherent in the magnitude matching condition of Eq. (38) that the quantity the magnitude matching refers to is the fractional frequency deviations of the VCXO and VCO, and the voltage deviation of the correcting integrator. The fractional deviations of the VCXO and VCO must be matched for Eq. (38) to be satisfied. For example, if a 1000 MHz VCO is deviated 100 KHz peak to peak, this is a fractional deviation of 0.0001. The same fractional deviation applied to a 10 MHz VCXO means it must be deviated 1 KHz peak to peak. The VCO may typically be modulated quite a significant fraction of its center frequency. However, typical reference oscillators are relatively limited in the extent to which their frequency can be adjusted due to the very high Q of crystal resonators, thus limiting the achievable data rate. The 1 KHz deviation of a 10 MHz VCXO given as an example is actually difficult to attain in many cases.

However, since the modulation of the VCXO 2 reference is limited to lower frequencies by the low pass nature of VCXO blending function Bx(s) 80, greater data rates than implied by the frequency deviation limit of the VCXO 2 can be achieved by limiting the amplitude of the low-frequency content of the data either through intelligent adjustments to the transmitted data pattern or implicitly in the protocol used to format the data. For example, a typical format protocol might guarantee that the data duty cycle (percentage of transmitted bits which have a value of "1") can never fall below 25% nor rise above 75% over any period of time where the VCXO 2 frequency would noticeably changed by the VCXO blending function (Bx(s)) 80 low pass filtered modulation. This guarantee in turn ensures that the low frequency content of the transmitted data stream can never require more than half of the VCXO 2 deviation than would be required to allow pure DC FM at the high deviation which would be required at the maximum data rate. Thus the frequency deviation and data rate achieved could be effectively doubled as compared to the maximum data rate which would otherwise be supported by a VCXO 2 reference oscillator with a given amount of "bendability" or tune range. Mathematically, the reduction in required VCXO deviation is described as a change in the magnitude matching function allowing for a smaller VCXO fractional deviation than the VCO fractional deviation. This reduction is allowed because the average VCO fractional frequency deviation from zero over a period of time sufficient for the phase locked loop to have noticeable response has also been reduced by the duty cycle restriction.

Recognition of this possibility allows several advances to the performance or simplifications of the design of the three point modulated synthesizer in addition to just the possible increase in maximum data rate. For a given data rate the tune range of the VCXO 2 may be reduced, thus allowing a more stable, more easily designed, or more compact and cost effective VCXO 2. In some cases the limiting of the tune range of the VCXO 2 may also allow avoidance or simplification of VCXO 2 linearization. DC limiting protocols are in fact commonly used in practice because the avoidance of very long strings of zeroes and ones in the transmitted data stream increases the reliability of clock extraction needed to perform the bit and word synchronization functions that are inherently required in demodulation of received digital data.

The initiation of modulation can present a special problem for a modulated phase locked loop. If the unmodulated carrier has settled to the final carrier frequency with the digital modulation being steady state at either a zero or one value, then the initiation of modulation will initially deviate the carrier by the full peak to peak amount. However, it is only desired to deviate by the peak amount on either side of the carrier frequency. The initial peak to peak deviation is twice that desired, and thus the initial bits transmitted may not be correctly received until the phase locked loop has had time to resettle the average frequency to the desired carrier.

This undesired initial transient response may be eliminated by the methods of "midpoint modulation" displayed in FIGS. 25 and 26 respectively. In general, some implementation of initial modulation transient response elimination is needed, though this problem is subtle and not appreciated by many designers. The cause of the problem is the typically single supply digital systems that generate data modulation. Prior to synthesizer loop lock, no data is of course generated, and when it is generated it begins at a low or high voltage. Once modulation is in progress, it typically has a long term average value of about half the logic level used. Thus the initiation of modulation introduces a DC step function of plus or minus half the supply level used into the modulation. This step function will have to be settled out by the PLL before "good" data is received. This settling process will typically take tens to hundreds of data bit times, so is a very undesirable burden. The problem has received some attention, as evidenced by the patents of Takaki and Chadwick. The methods we present are higher performance DC coupled implementations than the AC coupled implementation of U.S. Pat. No. 5,493,257 (Chadwick), and simpler and lower cost than the DC solution presented in U.S. Pat. No. 4,609,886 (Takaki).

Referring now to FIG. 25 there is shown a midpoint modulation circuit utilizing "second signal DC subtraction". In this circuit signal NowMod* 352 is summed with the modulation signal Data 350 at the initiation of modulation. NowMod* 352 is a negative logic signal that is of opposite state to the logic one state of signal Data 350. NowMod* 352 is initially in the logic one state, here shown as "high" but which could be defined as "low", and simply changes state at the initiation of modulation and then remains in that state as long as modulation continues. Signal Data 350 begins at the opposite value from NowMod* 352, and then toggles according to the data to be transmitted. A simple network composed of resistors 356 and 358, where NowMod* 352 is applied to first midpoint resistor 358 which is twice the value of second midpoint resistor 356 through which signal Data 350 is applied, scales the signals such that NowMod* 352 exactly cancels half the initially applied modulation of signal Data 350 as seen in summed output signal Vmod 354. The output Vmod 354 at any time is calculated as follows:

$$V_{mod} = \frac{Vcc}{3}(NowMod^* + 2Data) \qquad \text{Eq. (47)}$$

where NowMod* and Data signals have logic value of 0 or 1 when inserted in the equation but physical values of 0 and Vcc. This equation may be simplified for the cases before and after modulation beginning as follows:

$$V_{mod} = \frac{Vcc}{3}, \quad \text{Eq. (47A)}$$

prior to modulation when NowMod* is high and Data is low, and $$V_{mod} = \frac{2VccData}{3}, \quad \text{Eq. (47B)}$$

during modulation when NowMod* is low and Data is toggling between 0 and 1.

Now referring FIG. 25A, there is shown a graphical representation of the NowMod* 352, signal Data 350 and desired output Vmod 354. The circuit described generates the desired behavior of deviating half the peak value from the centered carrier at the initiation of modulation, and thereafter deviating the desired peak to peak value around the centered carrier in sympathy with the data. The actual voltage swing generated on output Vmod 354 is from 0 to two thirds of Vcc, centered at one third of Vcc.

Referring now to FIG. 26 there is shown another midpoint modulation circuit based on the modulation signal driver being in a high impedance state prior to initiation of modulation, with a bias string composed of first midpoint resistor 356 and second midpoint 358 being of equal value and providing a mid value bias for the effective modulation signal in the time period prior to initiation of modulation. This method shall be defined herein as the "switching method of midpoint modulation". This circuit may include an analog, switch 362 as shown for the purpose of applying a high impedance state prior to modulation and a low impedance drive state during modulation, but is most convenient to use when the system microcontroller has a high impedance state available on an output pin used as the data driver. When such a high impedance state is available on the driver pin this method is then conveniently implemented with just two resistors, which is a significant advance on the efficiency of prior art methods. A graphical representation of the signal Data 350 and Vmod 354 is shown in FIG. 26A. Note that the signal output Vmod 354 now varies from 0 to Vcc and swings around a midpoint of one half of Vcc. Different scaling is thus required for this form than for the second signal DC subtraction case to arrive at the same frequency deviation.

Referring a now to FIG. 27 there is shown a circuit simplification for the bypassed correcting integrator 123. Since the bypassed correcting integrator 123 acts as a single order low pass filter except for a change in sign, it is feasible in some implementations to make this substitution. The desirability of this substitution is based upon the availability of appropriate sign inverting and scaling circuitry. For example, in FIG. 24 the gain of the correcting, integrator 58 was adjusted for frequency and unit to unit component variation with digital potentiometer 208. The replacement of the bypassed correcting integrator 123 with a the first order low pass filter is an efficient change if some means of varying the drive to the low pass filter is conveniently available in the particular circuit, or if the accuracy required in the particular application allows a fixed integrator gain.

Since the first order low pass filter is mathematically equivalent to the bypassed correcting integrator 123, the term "bypassed correcting integrator" in the present invention should be understood to encompass the two special cases of an actual bypassed correcting integrator based upon an operational amplifier, and the first order low filter substitution, as well as any other similar form. FIG. 27A shows a Bode plot of the circuit of FIG. 27. The s domain transfer function whose magnitude is plotted in FIG. 28A is given as follows:

$$\frac{Vout(s)}{Vin(s)} = \frac{1}{sC_5R_5 + 1} \quad \text{Eq. (48)}$$

Referring now to FIG. 28, there is shown another embodiment of the three point frequency modulated synthesizer of the present invention. The block diagram shown in FIG. 28 is the same as that shown in FIG. 19 except for one aspect: the correcting integrator output (Ui) 64 is summed on the output side of the loop filter 22 instead of the input side as shown in FIG. 19. Modulating input (Vm) 30, through VCO scaling function (Av(s)) 96, is first summed with loop filter output (Uf) 26 at VCO summing node 28 in order to apply the necessary VCO modulation. The VCO summing node output (Uv) 36 is then summed with correcting integrator output (Ui) 64 scaled by F(s) block 69 at correcting integrator summing node 71. The purpose of block F(s) 69 is to account for the fact that the summing occurred on the output side of the loop filter. That the proper form for F(s) 69 is to be identical to loop filter F(s) 22 is proved mathematically as follows. The transfer function of modulating input Vm 30 modulation to VCO output frequency 46 of the modified 3 point form of FIG. 28 may be derived as:

$$H_{fm}(s) = \frac{\omega_{out}}{v_m} = \frac{K_0A_v\left(s + \frac{FK_iB_iA_i}{A_v} + \frac{FK_dK_{ox}B_xA_x}{MA_v}\right)}{s + \frac{K_oFK_d}{N}} \quad \text{Eq. (49)}$$

But this is exactly the same as Eq. (33) which applies to the circuit shown in FIG. 19. Thus all the subsequent analysis and derivation of the special case two point forms and the development of the appropriate blending functions for the three point modulation synthesis form of FIG. 19 apply identically here. The form is simply a less efficient circuit implementation of the same concepts discussed above. The circuit of FIG. 28 applies the correcting integrator to the output side of the loop filter, which is equivalent to summing into one or more input control ports of the VCO 40.

Phase modulation of a phase locked loop synthesizer may also be performed by the three point method. Phase modulation may also be performed by the two point method as described by Drucker, but that approach has performance limitations as compared to the full three point form. One advantage in implementation of phase modulation as compared to frequency modulation is that the loop lock variable is the same as the modulation variable. Thus, prevention of loop response to phase modulation will require a "correcting amplifier", as opposed to a "correcting integrator". The major problem that a correcting integrator introduces, the fact that it cannot perform correction of pure DC modulation due to the integrator output having to reach a limit, is immediately avoided. A correcting amplifier can correct for DC response with a limited DC output, an output step as opposed to a ramp that rises indefinitely, thus immediately allowing a two point DC modulated form. There is, however, a significant second order problem that arises with the Drucker two point form. The constant DC offset of DC phase modulation requires that the PLL phase detector have DC output. With digital phase detectors whose output is in pulse width form this output will cause significant sidebands at the loop sampling frequency. Suppression of these sidebands will then require a significantly smaller loop bandwidth, and thus the major degradation of slower lock times and less microphonic suppression. This problem is significantly reduced by the 3 point modulation form where reference modulation eliminates most of the phase build up that leads to non-zero phase error.

Referring now to FIG. 29, there is shown a block diagram of a three point phase modulated phase locked loop synthesizer. The primary difference between this block diagram and the frequency modulated form of FIG. 19 is that the correcting integrator has been replaced with correcting amplifier 61, and that VCXO differentiator function 83 and VCO differentiator function 95 have been placed in line with the VCXO 2 and VCO 40, respectively. The differentiator functions are inserted because any voltage controlled oscillator acts as an integrator of input voltage to output phase, and since the desired goal is to directly generate phase modulation differentiation is required to compensate for the integration. The scaling in line with VCO input voltage Uv 36 that drives the VCO 40 is the VCO gain $K_o$ and a VCO scaling factor $A_v$ 96. Blending functions are also included in FIG. 29, which have been defined as:

$$Ax(s)=AxX(s), \qquad \text{Eq. (50)}$$

the amplitude and frequency blending for the VCXO 2. Ax is a scaling constant and X(s) is a function which captures the low pass response of the VCXO 2. We also define:

$$Ac(s)=AcC(s), \qquad \text{Eq. (51)}$$

the amplitude and frequency blending function for the correcting amplifier. Ac is a scaling constant (which could have been folded in with correcting amplifier gain Kc) and C(s) is a frequency dependent function that is to be determined. The existence and form of the blending functions to cause this system to operate as desired are determined in the analysis below.

The mathematical analysis of the three point phase modulated PLL begins with defining the ideal phase modulation transfer function as:

$$\frac{\theta_{out}}{V_m}(s) = K_0 A_v, \qquad \text{Eq. (52)}$$

which is flat over frequency.

Now solving for the actual output phase as a function of input voltage it is found that:

$$\frac{\theta_{out}}{V_m}(s) = K_0 A_v \frac{\left(1 + \frac{F}{sA_v}\left(K_c A_c C(s) + \frac{K_d A_x X(s) K_{0x}}{M}\right)\right)}{1 + \frac{K_0 F K_d}{sN}} \qquad \text{Eq. (53)}$$

Now consider the special case of Ax=0, where the VCXO 2 is not modulated, so that Eq. (53) reduces to the case of two point correcting amplifier only. Then (53) reduces to:

$$\frac{\theta_{out}}{V_m}(s) = K_0 A_v \frac{\left(1 + \frac{F K_c A_c C(s)}{sA_v}\right)}{1 + \frac{K_0 F K_d}{sN}} \qquad \text{Eq. (54)}$$

Eq. (54) will reduce to desired ideal phase modulation function Eq. (52) if the following magnitude match condition is met:

$$K_c A_c C(s) = \frac{A_v K_0 K_d}{N} \qquad \text{Eq. (55)}$$

(magnitude match condition for 2 pt. phase modulated PLL with correcting amplifier and no modulation of reference) Eq. (55) proves that the matching integrator of frequency modulation does need to become a matching amplifier. In this simplified case C(s) is some constant that is not a function of frequency. While this simple case does provide DC modulation capability, it does suffer from non-zero pulse width on the phase detector output during modulation, which in turn cause undesired sidebands.

Now consider the special case of Eq. (53) where Ac=0, so that there is no correcting amplifier and the system becomes the two point modulated reference case. Now Eq. (53) reduces to:

$$\frac{\theta_{out}}{V_m}(s) = K_0 A_v \frac{\left(1 + \frac{F K_d A_x X(s) K_{0x}}{sMA_v}\right)}{1 + \frac{K_0 F K_d}{sN}} \qquad \text{Eq. (56)}$$

Eq. (56) will reduce to the ideal phase modulation function of Eq. (52) if:

$$\frac{A_x X(s) K_{ox}}{M} = \frac{A_v K_0}{N} \qquad \text{Eq. (57)}$$

(match condition for 2 point phase modulated PLL with modulated VCXO and no correcting amplifier)

Eq. (57) shows DC modulation capability, but note that holds over all frequency only if X(s) is flat. In practice X(s) must be of low pass form, so to hold this match condition over all frequency Av must become an identical low pass function of frequency. This immediately implies that while the system can operate without distortion, it may only be modulated over the frequency range within the low pass bandwidth of X(s) to do so. This is of course too low of a limit to be accepted in practice.

The system behaves in a similar fashion as the three point frequency modulated system in that the two forms of two point modulation have offsetting weaknesses. As blending functions were shown to exist for the frequency modulated case, it would seem that similar blending functions should exist for the phase modulated case. By assuming this is so and solving for them, they can be shown to be realizable. This process is begun by noting that the actual three point phase modulated PLL system as described by Eq. (53) will reduce to the ideal phase modulation transfer function of (52) if $$K_c A_c C(s) + K_d \frac{A_x X(s) K_{ox}}{M} = K_d \frac{A_v K_0}{N} \qquad \text{Eq. (58)}$$

Now let:

$$K_c A_c = \frac{K_d A_v K_0}{N} = \frac{K_d A_x K_{0x}}{M} = L_{pm}, \qquad \text{Eq. (59)}$$

where Lpm is defined as the "loop phase modulation matching value". Eq. (59) gives the required "magnitude matching" conditions for three point phase modulation. The definition of Lpm as given in Eq. (59) is inspired by the two magnitude matching conditions (55) and (57) for the two forms of two point phase modulation. We next seek a way of blending together these two forms over frequency so that the VCXO modulation prevents loop response at low frequencies, correcting amplifier modulation prevents loop response at high frequencies, and a blend of both prevents loop response at median frequencies.

From Eq. (59) it is seen that each term of Eq. (58) has a common factor of Lpm, which may then be dropped out, leaving:

$$C(s)+X(s)=1 \quad \text{Eq. (60)}$$

Eq. (60) gives the required "frequency blending" function for three point phase modulated phase locked loop frequency synthesis. It is understood that X(s) in Eq. (60) may be first, second, or higher order form, and as such represents the "total" X(s) describing the voltage to frequency transfer function of the VCXO.

In practice X(s) is a low pass function that may normally be approximated as being of first or second order form. Assuming the first order form as given in Eq. (40), we get:

$$X(s) = \frac{\omega_p}{s+\omega_p} \quad \text{Eq. (61)}$$

Substituting (61) into Eq. (60) and solving for C(s) yields:

$$C(s) = \frac{s}{s+\omega_p}, \quad \text{Eq. (62)}$$

a high pass form identical to the results attained for frequency modulation. However, recall for the frequency modulated correcting integrator case that the high pass blending function was most efficiently implemented as the bypassing of the correcting integrator. Here the high pass may be implemented in AC coupling the correcting amplifier output to the loop filter input, providing an efficient way to negate DC offsets that may be troublesome in practical circuit design while still maintaining ideal design.

Next assume that X(s) is the more accurate $2^{nd}$ order low pass form:

$$X(s) = \left(\frac{\omega_{p1}}{s+\omega_{p2}}\right)\left(\frac{\omega_{p2}}{s+\omega_{p2}}\right) \quad \text{Eq. (63)}$$

Now substituting into (60) yields:

$$C(s) = \left(\frac{s}{s+\omega_{p1}}\right)\left(1 + \frac{\omega_{p2}}{s+\omega_{p2}}\right) = F_1(s)F_2(s) \quad \text{Eq. (64)}$$

Again this results is identical to the frequency modulation results for blending for a two pole low pass response for the VCXO 2. The function F2(s) depicted in Eq. (64) may thus be similarly implemented as was shown in block 284 of FIG. 24. The function F1(s) is most advantageously implemented as AC coupling from the correcting amplifier output 62 into the to the loop filter input summing node 68.

The form of the analysis and the results for three point phase modulation have closely paralleled that developed for the three point frequency modulation. Identical needs to maintain the matching conditions over frequency, temperature, and unit to unit variation apply. These variations can be controlled for phase modulation in ways nearly identical to that for frequency modulation, and those enhancements to the other embodiments of the present invention apply for the phase modulation embodiment. The identical linearizing and calibrating methods also apply. Similarly, summing the correcting amplifier into the output side, rather than the input side, of the loop filter, applies to this embodiment of the present invention.

A particular embodiment of the invention has been described, but those skilled in the art will recognize that many modifications are possible that will achieve the same goals by substantially the same methods, and where those methods still fall within the true spirit and scope of the invention disclosed. In particular the use of various forms of reference frequency source and electronically controlled oscillators are within this scope. Therefore the invention should be considered to be limited in scope only in accordance with the following claims.

What is claimed is:

1. A three point frequency modulated system comprising:
   a) a phase locked loop frequency synthesizer system which synthesizes a carrier frequency utilizing an electronically controlled oscillator and comprising a reference frequency source and a bypassed correcting integrator, said system having a certain loop bandwidth;
   b) a modulating signal having a certain duty cycle simultaneously modulating said electronically controlled oscillator, said reference frequency source and said bypassed correcting integrator such that said carrier frequency is frequency modulated with a certain frequency deviation; and
   c) a magnitude matching function and a frequency blending function such that the resulting system frequency modulation is provided with the desired frequency deviation and with low distortion throughout a broad range of modulating frequency including that within said loop bandwidth.

2. The three point frequency modulated system of claim 1 wherein said reference frequency source is a voltage controlled crystal oscillator having an input control voltage and an output frequency.

3. The three point frequency modulated system of claim 1 wherein said reference frequency source includes a direct digital synthesizer.

4. The three point frequency modulated system of claim 1 further comprising a temporary switching function such that said phase locked loop circuit is temporarily switched and the bandwidth thereof is increased for purposes of minimizing synthesizer lock time for frequency switching.

5. The three point frequency modulated system of claim 1 further comprising as least one compensating function.

6. The three point frequency modulated system of claim 5 wherein said at least one compensating function is applied to control the output of at least one of the electronically controlled oscillator, reference frequency source and bypassed correcting integrator.

7. The three point frequency modulated system of claim 6 wherein said at least one compensating function is a digital compensating function.

8. The three point frequency modulated system of claim 7 wherein said digital compensating function compensates the magnitude of said modulating signal applied to at least one of said electronically controlled oscillator, reference frequency source and bypassed correcting integrator such that magnitude matching is more accurately maintained.

9. The three point frequency modulated system of claim 7 wherein said digital compensating function compensates the effective gain of at least one of said electronically controlled oscillator, reference frequency source and bypassed correcting integrator such that magnitude matching is more accurately maintained.

10. The three point frequency modulated system of claim 8 wherein said modulating signal has a digitized form and wherein said digital compensating function is comprised of a digital to analog converter which is driven by a digital word stream and which controls said reference frequency source such that digital signal processing of the digitized form of said modulating signal is applied to said digital word stream driving said digital to analog converter.

11. A three point frequency modulated system comprising:
   a) a phase locked loop frequency synthesizer system which synthesizes a carrier frequency utilizing an electronically controlled oscillator and comprising a reference frequency source and a bypassed correcting integrator, said system having a certain loop bandwidth; and
   b) a modulating signal having a certain duty cycle simultaneously modulating said electronically controlled oscillator, said reference frequency source and said bypassed correcting integrator such that said carrier frequency is frequency modulated with a certain frequency deviation, said reference frequency source and said electronically controlled oscillator having a fractional frequency deviation, said modulating signal applied to said reference frequency source being scaled such that said modulating signal causes a smaller fractional deviation of the frequency of said reference frequency source than the fractional frequency deviation of said electronically controlled oscillator caused by said modulating signal when applied to said electronically controlled oscillator.

12. The three point frequency modulated system of claim 11 wherein the duty cycle of said modulating signal is controlled to allow the frequency deviation required of said reference frequency source to achieve an approximate magnitude matching condition to said fractional frequency deviation of said electronically controlled oscillator.

13. A method of three point frequency modulation comprising the steps of:
   a) providing a phase locked loop frequency synthesizer circuit which synthesizes a radio frequency carrier within a certain loop bandwidth utilizing an electronically controlled oscillator, a reference frequency source, and a bypassed correcting integrator;
   b) applying simultaneously a modulating signal to said electronically controlled oscillator, said reference frequency source and said bypassed correcting integrator to frequency modulate said carrier; and
   c) maintaining proper magnitude matching of the modulation of said electronically controlled oscillator, said reference frequency source and said bypassed correcting integrator over frequency by frequency blending said reference frequency source and said bypassed correcting integrator.

14. The method of three point modulation of claim 13 whereby said frequency blending is implemented by digital signal processing.

15. A three point frequency modulated system, comprising:
   a. a phase locked loop frequency synthesizer circuit which synthesizes a radio frequency carrier within a certain loop bandwidth utilizing an electronically controlled oscillator, a reference frequency source, a bypassed correcting integrator, and a loop filter with a loop filter output;
   b. a modulating source having a data duty cycle simultaneously modulating said electronically controlled oscillator, said reference frequency source and said bypassed correcting integrator to frequency modulate said carrier with a certain frequency deviation, and;
   c. a filter substantially equivalent to said loop filter cascaded from said bypassed correcting integrator; said substantially equivalent filter having an output which is summed into said loop filter output.

16. The three point frequency modulated system of claim 15 further comprising a magnitude matching function and a frequency blending function such that the resulting system frequency modulation is provided with the desired frequency deviation and with low distortion throughout a broad range of modulating frequency including that within said loop bandwidth.

17. A method of three point frequency modulation, comprising the steps of:
   a. providing a phase locked loop frequency synthesizer circuit which synthesizes a radio frequency carrier within a certain loop bandwidth utilizing an electronically controlled oscillator, a reference frequency source, a bypassed correcting integrator and a loop filter;
   b. applying simultaneously a modulating signal to said electronically controlled oscillator, said reference frequency source and said bypassed correcting integrator to frequency modulate said carrier;
   c. providing a filter substantially equivalent said loop filter cascaded from said correcting integrator; and
   d. summing the output of said bypassed correcting integrator and said substantially equivalent filter into the output of said loop filter.

18. The method of three point frequency modulation of claim 17 further comprising the step of magnitude matching within said phase locked loop frequency synthesizer such that proper magnitude matching over frequency within the synthesizer is maintained by frequency blending of said reference frequency source and said bypassed correcting integrator.

19. A three point phase modulated system comprising:
   a) a phase locked loop frequency synthesizer circuit which synthesizes a carrier frequency utilizing an electronically controlled oscillator having an output, said circuit comprising a reference frequency source which controls the frequency of said electronically controlled amplifier and a correcting amplifier, said circuit having a certain loop bandwidth;
   b) a modulating signal which simultaneously modulates said electronically controlled oscillator, said reference frequency source and said correcting amplifier such that said electronically controlled oscillator output is phase modulated; and
   c) a magnitude matching function and a frequency blending function such that the resulting system phase modulation is provided with low distortion throughout a broad range of modulating frequency including that within said loop bandwidth.

20. A method of three point phase modulation comprising the steps of:
   a) providing a phase locked loop frequency synthesizer circuit which synthesizes a radio frequency carrier within a certain loop bandwidth utilizing an electronically controlled oscillator, a reference frequency source, and a correcting amplifier;
   b) applying simultaneously a modulating signal to said electronically controlled oscillator, said reference frequency source and said correcting amplifier to phase modulate said carrier; and
   c) maintaining proper magnitude matching of modulation of said electronically controlled oscillator, said reference frequency source and said correcting amplifier over frequency by frequency blending said reference frequency source and said correcting amplifier.

* * * * *